(12) United States Patent
Ito et al.

(10) Patent No.: US 7,037,788 B2
(45) Date of Patent: May 2, 2006

(54) MANUFACTURING METHOD OF SEMICONDUCTOR DEVICE

(75) Inventors: Hiroyasu Ito, Nagoya (JP); Masatoshi Kato, Aichi-gun (JP); Takafumi Arakawa, Kariya (JP)

(73) Assignee: Denso Corporation, Kariya (JP)

( * ) Notice: Subject to any disclaimer, the term of this patent is extended or adjusted under 35 U.S.C. 154(b) by 65 days.

(21) Appl. No.: 10/786,107

(22) Filed: Feb. 26, 2004

(65) Prior Publication Data

US 2004/0166637 A1 Aug. 26, 2004

Related U.S. Application Data

(62) Division of application No. 09/865,704, filed on May 29, 2001, now abandoned.

(30) Foreign Application Priority Data

May 30, 2000 (JP) .............................. 2000-159685

(51) Int. Cl.
*H01L 21/336* (2006.01)
(52) U.S. Cl. .................. 438/268; 438/270; 438/272
(58) Field of Classification Search ................ 438/268, 438/270, 272, 309
See application file for complete search history.

(56) References Cited

U.S. PATENT DOCUMENTS

| 5,072,266 | A | 12/1991 | Bulucea et al. |
| 5,448,083 | A | 9/1995 | Kitagawa et al. |
| 5,578,508 | A * | 11/1996 | Baba et al. ................. 438/270 |
| 5,674,766 | A * | 10/1997 | Darwish et al. ............. 438/270 |
| 5,895,951 | A | 4/1999 | So et al. ..................... 257/330 |
| 5,907,776 | A | 5/1999 | Hshieh et al. .............. 438/270 |
| 5,998,836 | A | 12/1999 | Williams |
| 6,049,108 | A | 4/2000 | Williams |
| 6,051,468 | A * | 4/2000 | Hshieh ....................... 438/270 |
| 6,110,799 | A | 8/2000 | Huang ........................ 438/430 |
| 6,140,678 | A | 10/2000 | Grabowski et al. |
| 6,211,018 | B1 * | 4/2001 | Nam et al. .................. 438/270 |
| 6,213,869 | B1 | 4/2001 | Yu et al. ..................... 458/236 |

FOREIGN PATENT DOCUMENTS

| JP | B2-2590863 | 9/1988 |
| JP | A-5-226351 | 9/1993 |

(Continued)

OTHER PUBLICATIONS

S. Wolf, "Silicon Processing for the VLSI Era," vol. 2—"Process Integration," Lattice Press (Sunset Beach, CA), ISBN 0-961672-4-5 (1990); particularly pp. 658-663.

*Primary Examiner*—Mary Wilczewski
*Assistant Examiner*—Toniae M. Thomas
(74) *Attorney, Agent, or Firm*—Posz Law Group, PLC

(57) ABSTRACT

By improving profile of impurity concentration in a channel portion of an FET or an IGBT of a trench gate type, variation of threshold value is lessened, and a destruction caused by current concentration is prevented while suppressing deterioration of cut-off characteristics. An island of a base region of p-type is formed in a semiconductor substrate of n-type by carrying out high acceleration ion implantation twice followed by annealing, so that the impurity concentration profile in a channel portion changes gradually in a depth direction. Accordingly, it is possible to lessen variation of the threshold value and to reduce pinch resistance while at the same time improving sub-threshold voltage coefficient and conductance characteristics.

11 Claims, 18 Drawing Sheets

FOREIGN PATENT DOCUMENTS

| | | |
|---|---|---|
| JP | A-6-151867 | 5/1994 |
| JP | A-5-206264 | 8/1994 |
| JP | A-7-249770 | 9/1995 |
| JP | A-8-264772 | 10/1996 |

* cited by examiner

MEASUREMENT OF HIGH VOLTAGE
WITHSTANDING DIODE

MANUFACTURING METHOD OF SEMICONDUCTOR DEVICE

CROSS REFERENCE TO RELATED APPLICATION

This application is a divisional application of U.S. patent application Ser. No. 09/865,704 filed May 29, 2001, now abandoned, which is based on Japanese Patent Application No. 2000-159685 filed on May 30, 2000, the contents of which are incorporated herein by reference.

BACKGROUND OF THE INVENTION

1. Field of the Invention

The present invention relates to a semiconductor device adapting a trench gate structure (with a gate buried in a trench), and more particularly to a trench gate type semiconductor device capable of withstanding a high voltage and a manufacturing method of the same.

2. Related Arts

With regard to a semiconductor device serving as an integrated circuit, there have been proposed various structures, in one of which, for example, elements are isolated by a trench provided on a surface of a semiconductor substrate as one of trends for improving in degree of integration and for improving characteristics. On the other hand, as to a semiconductor device serving as a power element or the like, a trench gate structure (with a gate buried in a trench) has been proposed in order to attain lower ON resistance and lower ON voltage.

The present invention relates to the semiconductor devices of the foregoing structures, and has an object to solve technical problems occurring during the fabrication sequence and derived from the structure thereof. The following description will describe prior arts and three technical problems occurring in the prior arts.

First, in a semiconductor device having a MOS structure in a power MOSFET or an IGBT, a diffusion layer for forming a channel is provided by the double diffusion method. This method is also applied to form a channel-forming diffusion layer in the trench gate type semiconductor device.

FIGS. 20A to 20J show a typical fabrication sequence of a conventional trench gate type semiconductor device by use of the double diffusion method. As shown in FIG. 20A, an oxide film 2 serving as a mask material is formed on a semiconductor substrate 1 having a n-type principal surface. Then, p-type impurities (boron, B) are implanted at acceleration energy of approximately 100 keV by ion implantation, whereby an ion implantation layer 3a is formed (FIG. 20B). After that, an island-shaped base region 3 is formed within an element forming region by diffusing the impurities (FIG. 20C).

Next, n-type impurities are implanted at high concentration into the base region. 3 by ion implantation and then diffused, whereby a highly doped emitter region 4 is formed inside the base region 3 (FIG. 20D). A trench 5 is formed by anisotropic etching to the double diffused and highly doped emitter region 4 (FIG. 20E). A gate insulation film 6 is formed over an inner wall surface of the trench 5 (FIG. 20F). Subsequently, a polycrystalline silicon layer 7 is deposited entirely on the substrate (FIG. 20G), which is then etched away except for a portion filling an opening of the trench 5, whereby a gate electrode 8 is formed (FIG. 20H).

Then, a highly doped p-type region 9 is formed inside the base region 3 by introducing p-type impurities at high concentration (FIG. 20I). After that, an insulation film 10 is deposited entirely on the substrate, and is patterned so as to electrically isolate the gate electrode 8. Then, an emitter electrode 11 is formed (FIG. 20J). Further, a metal electrode is formed on a back surface (not shown). Accordingly, a trench gate type MOSFET (with the gate buried in the trench) is fabricated.

FIG. 21 shows an impurity concentration profile (corresponding to a view taken along a line XXI—XXI in FIG. 20J) along a depth direction of a channel portion in a trench gate type semiconductor device which is equivalent to the one shown in FIG. 20J manufactured by the fabrication sequence discussed above. As shown in FIG. 21, the impurity concentration profile in the channel portion (equivalent to the concentration profile of the p-type region) has a sharp pointed concentration profile (a portion indicated by an open arrow in the drawing) at the depth close to the highly doped emitter region 4.

Thus, in case of the trench gate type semiconductor device manufactured by the double diffusion method as described above, a threshold voltage is determined by a maximum impurity concentration in the channel portion, and cut-off characteristic is susceptible to a width of the maximum impurity concentration region. Accordingly, in the prior art in which the width of the maximum impurity concentration region is narrow, a variation of the threshold value, a destruction of the semiconductor device caused by current concentration due to the variation of the threshold value, and deterioration of cut-off characteristics occur.

In addition, in the case that the semiconductor device having the above-described structure is manufactured as a trench gate type IGBT, there is a technical problem as follows.

Namely, in the IGBT having a highly doped p-type region formed on the back surface of the semiconductor substrate 1, there is a parasitic bipolar operation which is known as a problem intrinsic to the IGBT. The bipolar operation depends on a resistance value (hereinafter, referred to as a pinch resistance) of the base region 3 beneath the highly doped emitter region 4. Thus, in the IGBT manufactured by the method in the prior art described above, the pinch resistance increases due to the sharp concentration profile in the channel portion, whereby the parasitic bipolar operation is readily triggered.

Also, as a second technical problem to be solved by the present invention, there is a problem resulted from the prior art as follows. That is, in a conventional trench gate type power semiconductor device capable of withstanding a high voltage, various attempts have been made in efforts to improve the withstand voltage. FIGS. 22A and 22B are schematic cross sectional views each showing a structure of an IGBT as a typical power element. FIG. 22A shows an IGBT, in which a p-type region 12a is formed on the back surface of a semiconductor substrate 12, and the trench gate structures are formed in the manner as described above at a narrow pitch. According to this structure, by narrowing a spacing between the trench gate structures, an electric field developed at the bottom of the trench 5 at the breakdown is alleviated, thereby making it possible to improve a gate withstand voltage.

This arrangement can alleviate the concentration of the electric field. However, the point of concentration of the electric field still exists at the bottom portion of the trench gate structure. Thus, the gate insulation film 6 is damaged by hot carriers due to the concentration of electric field at breakdown. Hence, there is a technical problem that it is difficult to prolong the service life of this element.

On the other hand, FIG. 22B shows an arrangement to improve the withstand voltage not by narrowing the spacing between the trench gate structures, but by providing a structure referred to as a P body. More specifically, the basic arrangement is the same as the one shown in FIG. 22A, but a larger spacing is secured between the adjacent trench gate structures, and a p-type region (hereinafter, referred to as the P body layer) 13 with a deep junction is formed in the spacing region, so that the electric field developed at the bottom portion of the trench gate structure is alleviated, thereby making it possible to improve the withstand voltage.

The IGBT (trench gate type semiconductor device) having the P body structure is manufactured by the fabrication sequence detailed in FIGS. 23A through 23I. More specifically, p-type impurities are implanted into the regions partially at the both sides of a trench forming portion by ion implantation on the surface of the semiconductor substrate 12 (the p-type region 12a on the back surface is omitted herein)(FIG. 23A). The ion implantation is carried out through an oxide film 14 formed on the semiconductor substrate 12, on which a patterned photoresist 15 is provided as a mask. Then, an ion implantation layer 16 is formed partially by selectively implanting the p-type impurities at acceleration energy of approximately 100 keV, which is diffused so as to form the P body layer 13 (FIG. 23B). The following steps (FIGS. 23C through 23I) are the same as those respectively shown in FIGS. 20A through 20J detailing the fabrication sequence of the trench gate structure described above.

In this case, since the P body layer 13 is formed by diffusing the introduced impurities so that the P body reaches a predetermined depth, variation of the threshold value caused by lateral diffusion should be restrained. For this reason, a larger spacing has to be secured between the trench gate electrodes in comparison with the structure of the IGBT shown in FIG. 22A. This limiting factor makes it impossible to improve integration.

Further, a third technical problem will be explained as follows. Namely, a power semiconductor device capable of withstanding a high voltage is provided with a high voltage withstanding structure for alleviating the electric field at a peripheral portion of the element region. FIG. 24 is a cross sectional view showing one example of such a structure. According to this example, a guard ring 16 with a deep junction is provided at the peripheral portion of an island of the base region 3, and multiple strip-wise field limiting rings 17 for alleviating the concentration of the electric field on the surface of the substrate are formed in the n-type substrate region 12 at the periphery of the island shaped base region 3, so that the withstand voltage is improved.

Thus, the structure is provided with the region of the guard ring 16 formed at the periphery of the base region 3 and the region of the plurality of the field limiting rings 17 between the base region 3 and an EQR region at an outermost of the chip. Hence, the concentration of the electric field is alleviated by a deep junction with a large curvature between the base region 3 to which a high voltage is applied and the semiconductor substrate 12 serving as the collector. Moreover, the concentration of the electric field in the surface portion of the substrate is alleviated by a plurality of the field limiting rings 17. As a result, the withstand voltage of the device can be totally improved.

In this case, in the trench gate type IGBT having the P body structure shown in FIG. 22B discussed above, since the p-type guard ring 16 and field limiting rings 17 shown in FIG. 24 can be formed in the same step when the P body layer 13 is formed, the manufacturing cost is not increased.

On the other hand, in the narrow pitched trench gate type IGBT shown in FIG. 22A, the step of forming the p-type region with a deep junction is not provided primarily. Therefore, an additional special step is necessary to form the guard ring 16 and field limiting rings 17. Hence, the number of steps in the fabrication sequence is increased, whereby the overall cost is increased.

Further, in either of the structures shown in FIGS. 22A and 22B, the lateral diffusion is inevitable by the forming of the guard ring 16 and the field limiting rings 17 as the p-type regions with a deep junction, whereby the chip size is enlarged. Hence, there is a trade-off between an improvement of the withstand voltage and integration. As a result, one of the functions which is more desirable has to be selected.

After all, in the case that the conventional manufacturing method is adapted, the following problems occur. First, the variation of the threshold value caused by a sharp concentration profile in the channel portion, the destruction of the semiconductor device caused by the current concentration due to the variation of the threshold value, and the deterioration of cut-off characteristics occur. Second, in the IGBT, there are problems that a parasitic bipolar operation is readily-triggered and that the gate insulation film becomes less reliable since the gate insulation film is damaged by the hot carriers caused by the electric field concentrates at the bottom portion of the trench when the breakdown has occurred. Moreover, there is a problem that the manufacturing cost increases by providing with the high voltage withstanding structures.

SUMMARY OF THE INVENTION

The present invention is devised to solve the above problems, and has an object to provide a trench gate type semiconductor device having a gate buried in a trench and a manufacturing method of the same, by which it is possible to control variation of a threshold value and a parasitic bipolar operation caused by impurity concentration profile in a channel portion, and to prevent a destruction caused by current concentration and deterioration of cut-off characteristics due to variation of the threshold value.

Another object of the present invention is to provide a trench gate type semiconductor device having a gate buried in a trench, by which degree of integration is increased, and reliability of a gate insulation film is improved by alleviating an electric field developed at a bottom portion of the trench gate electrode when a breakdown occurs, while suppressing an increase of cost in forming a high voltage withstanding structure.

According to a first aspect of the invention, a second conductivity type region is formed by introducing impurities of a second conductivity type a plurality of times so as to have a smooth concentration profile in a depth direction. Thus, a profile of impurity concentration in a channel forming portion in the second conductivity type region changes gradually and the profile has a trapezoid-like shape. Consequently, when electrical conduction is established between a semiconductor substrate and a first conductivity type region by applying a voltage to a gate electrode, variation of a threshold value is lessened, and a pinch resistance, which is one of factors that affect how readily a parasitic bipolar operation occurs, is reduced.

According to a second aspect of the invention, a gate electrode portion is formed to protrude from an opening end portion of the trench so as to form a T-shaped cross section. Hence, it is possible to prevent damages by impurities introduced to the opening end portion of the trench, that is, by the impurities introduced into the highly doped first conductivity type region to form a highly doped layer for contact. Consequently, a structure of the semiconductor device mentioned above can prevent deterioration of the characteristics of a gate insulation film, and therefore, can provide the device with excellent characteristics.

According to a third aspect of the invention, each of a plurality of second trenches is formed inside the second conductivity type region. Each of the second trenches is positioned between an adjacent pair of the first trenches in parallel with the first trenches, and a second conductivity type protrusion region is formed with a junction deeper than a junction of the second conductivity type region by introducing impurities of the second conductivity type from each of the second trenches by ion implantation. Hence, the second conductivity type protrusion region can be formed with a deep junction while suppressing lateral diffusion. The second conduction type protrusion region alleviates an electric field developed at a bottom portion of an electrode portion in the first trench during operation. Accordingly, an injection of hot carries into a gate insulation film formed on each of the first trenches is suppressed by alleviating the concentration of the electric field. Consequently, reliability of the gate insulation film can be improved.

According to a fourth aspect of the invention, in the third aspect of the invention, an electrode portion is formed to protrude from an opening end portion of the first trench so as to form a T-shaped cross section. Hence, in addition to the effect discussed above, the same effect as that attained by the second aspect of the invention may be attained.

According to a fifth aspect of the invention, in the third aspect of the invention, an electrode is provided so as to electrically connects a highly doped first conductivity type region with the second conductivity type protrusion region. Hence, the effect of alleviating the electric field attained by the second conductivity type protrusion region discussed above can be attained more effectively.

According to a sixth aspect of the invention, in the fifth aspect of the invention, a portion of the second conductivity type region is disposed between an adjacent pair of the first trenches, where the second trenches are not formed. In addition, the portion is in an electrically floating state. Thus, when the device is switched ON by forming a channel between the semiconductor substrate and highly doped first conductivity type region when a voltage is applied to the electrode portion in the first trench, carriers having passed through the channel are released toward the semiconductor substrate of the first conductivity type. Here, at one side of the first trench where a contract hole is not provided, the portion of the second conductivity type region is formed in the electrically floating state. Therefore, a lower potential portion is formed between the second conductivity type region in the electrically floating state and the bottom portion of the electrode portion. In other words, a trough of potential is produced, which increases carrier releasing efficiency from the channel. Consequently, there can be attained an effect that an ON resistance or an ON voltage is lowered, thereby making it possible to improve the electric characteristics of the semiconductor device.

According to a seventh aspect of the invention, in the third aspect of the invention, first electrode is provided to first contact hole formed in one of the second trenches for electrically connecting the second conductivity type protrusion region with the highly doped first conductivity type region through the one of the second trenches. Second electrode is provided to second contact hole formed in another one of second trenches for electrically connecting the second conductivity type protrusion region with the highly doped first conductivity type region through the another one of second trenches. The second electrode is disposed adjacent to the first electrode. One of adjacent pair of the first and second electrodes is in an electrically floating state. Hence, from the viewpoint of the electrical characteristics, there can be attained substantially the same effect as that attained by the sixth aspect of the invention.

According to an eighth aspect of the invention, in the sixth aspect of the invention, a highly doped region for contacting the electrode is formed on a principal surface of the semiconductor so as to dispose between the electrode and the second conductivity type protrusion region. Hence, it is possible to achieve ohmic contact in this manner. In addition, since the highly doped region does not have to be provided on the side where the second trenches are not provided, it is possible to minimize damage caused when introducing the impurities.

According to a ninth aspect of the invention, in the seventh aspect of the invention, one of the first trenches encloses the portion of the second conductivity type region electrodes in the electrically floating state. The first trench makes it easier to place the portion of the second conductivity type region in the electrically floating state by the structure thereof. Therefore, the effect discussed above can be attained.

According to a tenth aspect of the invention, in the third aspect of the invention, the first trench is made shallower than the junction depth of the second conductivity type protrusion region. Hence, the concentration of the electric field at the electrode portion in the first trench can be shifted toward the second conductivity type protrusion region, thereby enhancing the effect discussed above.

According to an eleventh aspect of the invention, in the first aspect of the invention, a plurality of electric field alleviating regions are formed by introducing impurities of the second conductivity type in a strip-wise shape so as to enclose a peripheral portion of the second conductivity type region. Hence, these strip-wise electric field alleviating regions can be used as so-called guard ring and field limiting rings, thereby making it possible to achieve a high voltage withstanding structure required as one of the characteristics of a power semiconductor device.

According to a twelfth aspect of the invention, in the eleventh aspect of the invention, each of the electric field alleviating regions is composed of a strip-wise third trench, and a second conductivity type deep region formed through the third trench. Thus, the electric field alleviating regions can be formed effectively with a deep junction while suppressing the lateral diffusion. Namely, the electric field alleviating regions are formed in an area smaller than that of a case which the electric field alleviating regions are formed from the surface of the semiconductor substrate in the normal manner so as to have the same junction depth. Consequently, it is possible to adapt a high voltage withstanding structure while preventing the chip size from being upsized.

According to a thirteenth aspect of the invention, in the eleventh aspect of the invention, each of the electric field alleviating regions has a junction deeper than that of the second conductivity type region. Hence, it is possible to attain a higher withstand voltage than a withstand voltage which the second conductivity type region can withstand. Moreover, since the electric field alleviating regions can be formed in a same process of forming the second conductive type protrusion region described above, neither the number of steps nor the cost is increased substantially.

According to a fourteenth aspect of the invention, in the eleventh aspect of the invention, the semiconductor device is constituted as a gate driving type power element for controlling a conduction state between a back surface of the semiconductor substrate and said first conductivity type region by serving the electrode portion as a control electrode. Hence, for example, by employing first conductivity type semiconductor substrate as a semiconductor substrate, the device can be manufactured as a power MOSFET. Alternatively, by providing second conductivity type region on a back surface of the semiconductor substrate, the device can be manufactured as an IGBT.

According to a fifteenth aspect of the invention, a second conductivity type region is formed in a semiconductor substrate by implanting impurities of a second conductivity type a plurality of times. Hence, the profile of the impurity concentration of the second conductivity type region in the depth direction can be made smooth. Consequently, it is possible to achieve the arrangement of the second conductivity type region in the semiconductor device as set forth in the first aspect of the invention.

According to a sixteenth aspect of the invention, a polycrystalline silicon film is formed after the insulation film is provided in a trench formed by anisotropic etching. Then, the film is removed away so as to form a T-shaped cross section with a wider width than an opening of the trench. After that, a step of introducing impurities to form a highly doped layer for contact in a highly doped first conductivity type region subsequently, whereby it is possible to prevent damages caused by introducing the impurities from being generated at an opening end portion of the trench. Therefore, deterioration of the characteristics of the insulation film is suppressed.

According to a seventeenth aspect of the invention, in the fifteenth aspect of the invention, each ion implantation of the second conductivity type impurities is carried out on a condition that acceleration energy is 200 keV or higher. Hence, it is possible to distribute the implant ions to a depth of a channel forming region. Therefore, a concentration gradient of the impurities is formed gently in a depth direction in the channel forming region. Consequently, it is possible to achieve the electric characteristics attained by the semiconductor device as set forth in the first aspect of the invention discussed above.

According to an eighteenth aspect of the invention, in the seventeenth aspect of the invention, each ion implantation of the second conductivity type impurities is carried out under one of conditions that a dose is equal in each ion implantation, and that a dose is smallest in ion implantation with lowest acceleration energy. Hence, it is possible to attain smooth impurity concentration in the depth direction of the channel forming region, that is, a direction along the channel, thereby lessening the concentration gradient.

According to a nineteenth aspect of the invention, in the sixteenth aspect of the invention, the first conductivity type region having a higher impurity concentration than that of the semiconductor substrate in the second conductivity type region is formed under a condition that a dose of implant ions is equal to $1.0 \times 10^{15}$ (atoms/cm$^2$) or less. Hence, it is possible to form the highly doped first conductivity type region without deterioration of quality in a gate insulation film formed in a later step, which is caused by a impurity concentration.

According to a twentieth aspect of the invention, a plurality of second trenches each is formed in a second conductivity type region so as to position between an adjacent pair of first trenches in parallel with the first trenches, and a second conductivity type protrusion region is formed with a junction deeper than that of the second conductivity type region by introducing impurities of the second conductivity type through each of the second trenches by a plurality of implantation steps. Hence, the second conductivity type protrusion region can be formed with a deep junction while suppressing lateral diffusion. Since the second conduction type protrusion region alleviates the electric field developed at a bottom portion of an electrode portion in the first trench during operation, it becomes possible to suppress injection of hot carries into a gate insulation film by alleviating concentration of the electric field. Consequently, reliability of the gate insulation film can be improved.

According to a twenty-first aspect of the invention, in the twentieth aspect of the invention, a polycrystalline silicon film of is formed to have a T-shaped cross section with a wider width than that of an opening of the first trench. Hence, it is possible to prevent damages caused by introducing the impurities from being generated at an opening end portion of the trench in a step of introducing impurities to form a highly doped layer for contact in a highly doped first conductivity type region. Consequently, the structure can prevent deterioration of the characteristics of the gate insulation film, thereby making it possible to provide a semiconductor device with excellent characteristics.

According to a twenty-second aspect of the invention, in the twentieth aspect of the invention, at least one ion implantation of introducing the impurities of the second conductivity type inside each of the second trenches to form the second conductivity type protrusion region is carried out at acceleration energy of equal to 200 keV or more. Hence, when the impurities of the second conductivity type is introduced into a channel forming region of the semiconductor device, it is possible to achieve a smooth concentration profile in a depth direction of the channel forming region, that is, along the channel direction.

According to a twenty-third aspect of the invention, in the twentieth aspect of the invention, at lest one ion implantation of introducing the impurities of the second conductivity type inside each of the second trenches to form the second conductivity type protrusion region the plurality of times is carried out at acceleration energy of equal to 30 kev or less and a dose at equal to $1.0 \times 10^{15}$ (atoms/cm$^2$) or more. Hence, it is possible to achieve sufficiently high impurity concentration at a surface of the second conductivity type protrusion region inside the second trench described above.

According to a twenty-fourth aspect of the invention, in the twentieth aspect of the invention, the second conductivity type region is preferably formed by the manufacturing method of a semiconductor device as set forth in any of the fifteenth, seventeenth, eighteenth and nineteenth aspects of the invention. Thus, impurity concentration in a depth direction of a channel forming region, that is, the impurity concentration along the channel direction, can be made smooth. Consequently, it is possible to attain an arrangement of the second conductivity type region of the semiconductor device as set forth in the first aspect of the invention discussed above.

According to a twenty-fifth and a twenty-sixth aspects of the invention respectively, in each of the fifteenth and twentieth aspects of the invention, a plurality of electric field alleviating regions are formed by introducing impurities of the second conductivity type in a strip-wise shape so as to enclose a peripheral portion of the second conductivity type region. A strip-wise highly doped second conductivity type region is formed inside the electric field alleviating regions. Further, a strip-wise shape trench is formed inside the electric field alleviating regions. In addition, a deeper second conductivity type region is formed inside the strip-wise shape trench by introducing impurities of the second conductivity type a plurality of times. Then, a metal electrode is formed to electrically connect the strip-wise second conductivity type region with an inner surface of the strip-wise shape trench inside the deeper second conductivity type region. Hence, it is possible to provide a semiconductor device capable of withstanding a higher voltage.

According to a twenty-seventh and twenty-eighth aspects of the invention respectively, in each of the twenty-fifth and twenty-sixth aspects of the invention, the deeper second conductivity type region has a junction deeper than that of the second conductivity type region. Hence, it is possible to provide a semiconductor device capable of withstanding a higher voltage.

Other objects and features of the present invention will become more readily apparent from a better understanding of the preferred embodiment described below with reference to the following drawings.

DETAILED DESCRIPTION OF THE PREFERRED EMBODIMENTS

Figure 1A:
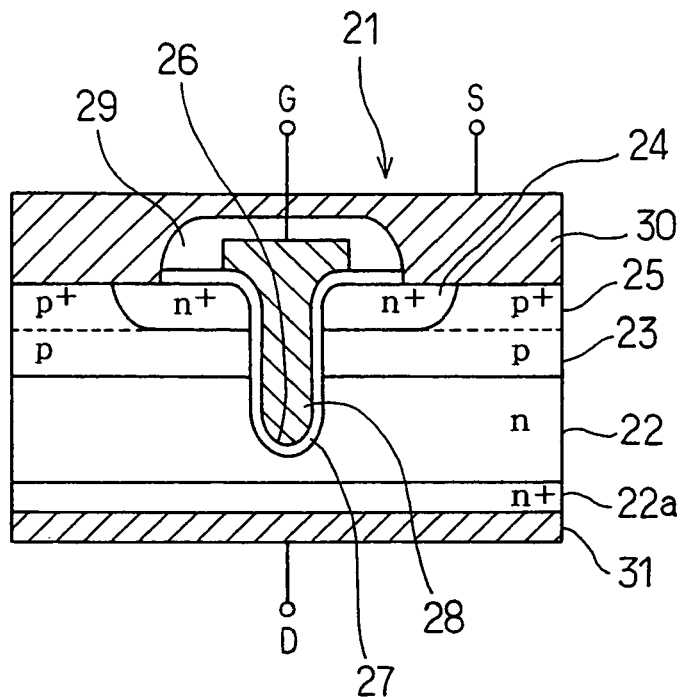
FIG. 1A is a schematic cross sectional view of a trench gate type MOSFET of a first embodiment of the present invention.

Specific embodiments of the present invention will now be described hereinafter with reference to the accompanying drawings in which the same or similar component parts are designated by the same or similar reference numerals.

(First Embodiment)

Referring to FIG. 1A to FIG. 6, a semiconductor device of the present invention is applied to a MOSFET or an IGBT of a trench gate type.

Figure 1B:
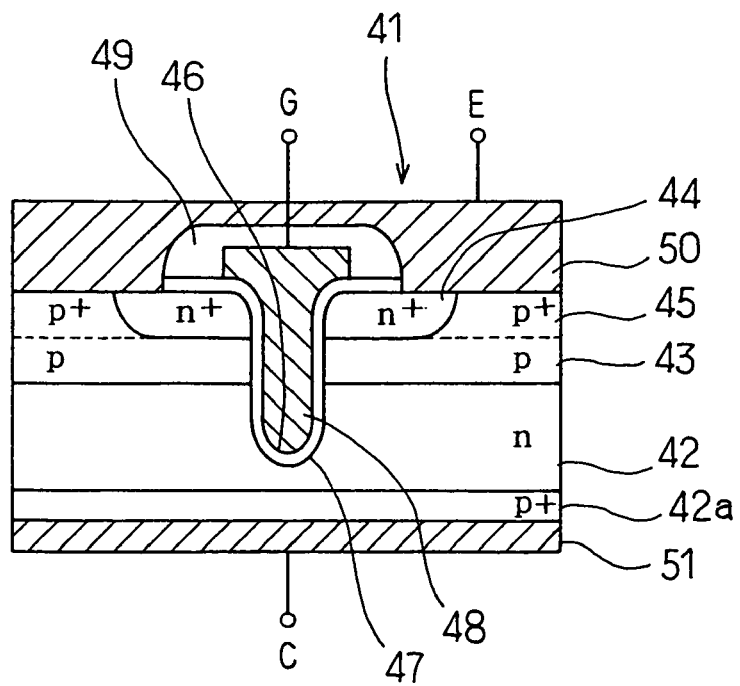
FIG. 1B is a schematic cross sectional view of a trench gate type IGBT of a first embodiment of the present invention.

FIGS. 1A and 1B are cross sections schematically showing structures of a gate portion of a MOSFET 21 and an IGBT 41 adapting the trench gate type structure of the present invention, respectively.

First of all, the following description will describe the MOSFET 21 with reference to FIG. 1A. A semiconductor substrate 22 having a n-type conductivity defined herein as a first conductivity type is provided with a highly doped n-type region 22a at a back surface thereof. Additionally, an island of a base region 23 is formed on a principal surface of the semiconductor substrate as a second conductivity type region, which is formed by introducing impurities of p-type defined herein as a second conductivity type into a region corresponding to an element forming region with plural of times ion implantations (FIG. 1A shows a gate electrode portion, and so a junction surface of the base region 23 is illustrated so as to extend to both ends of the substrate). Although it will be described below, a profile of an impurity concentration in a depth direction of the base region 23, that is, the profile of the impurity concentration in a direction along a channel region, is provided so as to change gradually or shape a trapezoid by the ion implantations.

A source region 24 is formed inside the base region 23 as a highly doped first conductivity type region by introducing impurities of the n-type as the first conductivity type at high concentration. Moreover, a highly doped p-type region 25 is formed at another region of the base region 23 by introducing the p-type impurities at high concentration. A trench 26 is formed to penetrate through the source region 24 and the base region 23 so that the trench 26 reaches the semiconductor substrate 21. The trench 26 is filled with polycrystalline silicon serving as a gate electrode 28 by interposing a gate insulation film 27 formed on the inner surface wall of the trench 26 having a predetermined film thickness.

An insulation film 29 is formed to cover the gate electrode 28, and the gate electrode 28 is electrically connected to an external from a predetermined portion. A source electrode 30 made of a metal film is formed to cover the insulation film 29 so as to achieve ohmic contact between a part of the source region 24 and the base region 23. Likewise, a drain electrode 31 made of a metal film is formed on an entire back surface.

Next, the following description will briefly describe the IGBT 41 adapting the trench gate type structure shown in FIG. 1B. In the IGBT 41, a semiconductor substrate 42 of the n-type as the first conductivity type is provided with a highly doped p-type layer 42a on an back surface thereof, which is formed by introducing the p-type impurities as the second conductivity type impurities at high concentration. The IGBT 41 has the same structure as the MOSFET 21 described above except that the semiconductor substrate 42 is employed.

In other words, the IGBT 41 is provided with a base region 43 of the p-type as the second conductivity type, a highly doped n-type emitter region 44 formed by introducing impurities of the n-type as the first conductivity type at high concentration, a highly doped p-type region 45, a trench 46, a gate insulation film 47, a gate electrode 48, an insulation film 49, an emitter electrode 50, and a collector electrode 51 formed on the back surface. As shown in FIGS. 1A and 1B, both are formed in the same manner except that the members referred to as the source and drain in the former are respectively referred to as the emitter and collector in the latter.

According to the arrangement described above, in either of the MOSFET 21 and IGBT 41, it is arranged in such a manner that a smooth impurity concentration profile will be formed in a depth direction of the base region 24 or 44. Thus, it is possible to reduce pinch resistance at the base region 24 or 44 for forming a channel when the device is controlled by applying a control voltage to the gate electrode 28 or 48. Moreover, a sub-threshold voltage coefficient can be improved, thereby making it possible to improve a cut-off characteristics and an amplification factor of a FET. Further, it is also possible to improve conductance characteristics that contribute to current performance of the FET. More concrete data as to the above-mentioned improvements of the characteristics will be explained below with reference to accompanying drawings after a description of the fabrication sequence is explained.

Next, the following description will describe the fabrication sequence, in particular, a step of forming the gate electrode 28 and 48, of the MOSFET 21 and IGBT 41 each adapting the trench gate type structure arranged as described above with reference to FIGS. 2A through 2K. In the drawings, numeral references used for the MOSFET 21 shown in FIG. 1A are used. It should be noted, however, that the same description is applied as a fabrication sequence of the IGBT 41 by replacing the numeral references with those labeled to the corresponding members.

Figure 2A:
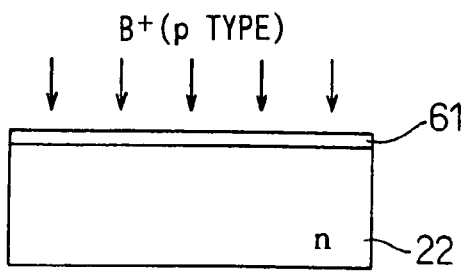
FIGS. 2A through 2K are schematic cross sectional view showing manufacturing steps of the MOSFET in the first embodiment.
Figure 2B:
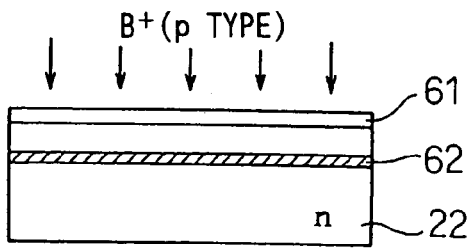
Figure 2C:
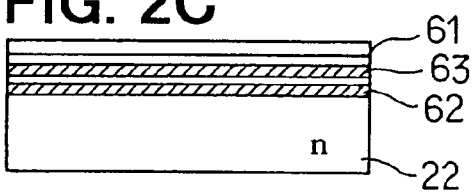
Figure 2D:
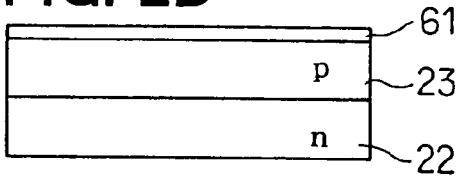

As shown in FIG. 2A, a thermal oxide film having a film thickness of 40 nm, for example, is formed as a mask material 61 on a surface of a semiconductor substrate 22 of the n-type. Then, a first ion implantation layer 62 is formed by conducting a first high acceleration ion implantation through the mask material 61 at an acceleration voltage of 480 keV, for example. The first high acceleration ion implantation is carried out in such a manner that impurities of the p-type as the second conductivity type impurities, such as boron ions (B), are implanted into the semiconductor substrate 22 with a dosage of $5.0 \times 10^{13}$ (atoms/cm$^2$). Moreover, the implant ions are selectively introduced into an island region corresponding to the base region 23 as an element forming region (see FIG. 2B). In the drawings, only a center portion of the base region 23 is illustrated, and a peripheral portion of the island region is omitted.

Then, a second high acceleration ion implantation is carried out through the same mask material 61. The second high acceleration ion implantation is carried out at a acceleration voltage of 320 kev, for example, which is different from that in the first high acceleration ion implantation, in such a manner that impurities of the p-type, such as boron ions (B), are implanted into the semiconductor substrate 22 with a dosage of $5.0 \times 10^{13}$ (atoms/cm$^2$) to shape the same island region as that shaped in the first high acceleration ion implantation, whereby a second ion implantation layer 63 is formed (see FIG. 2C). By conducting annealing subsequently, the base region 23 having a gradual convex impurity concentration profile shaped into nearly the aforementioned trapezoid is formed (see FIG. 2D).

Figure 2E:
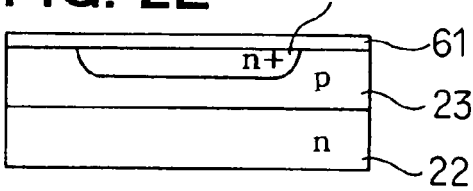

Then, by introducing impurities of the n-type as the impurities of the first conductivity type, such as arsenic (As), inside the base region 23 by ion implantation followed by annealing, a source region 24 as a highly doped first conductivity type region is formed (see FIG. 2E). Here, a dosage of implant ions into a region that will be made into the source region 24 is set to $1.0 \times 10^{15}$ (atoms/cm$^2$) or less, so as not to deteriorate film quality of a gate insulation film 27 formed at an opening portion of a trench 26 that will be formed in a latter step.

Figure 2F:
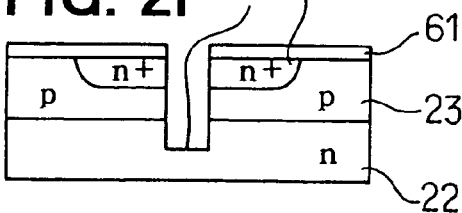

Subsequently, the trench 26 is formed in the thickness direction of the semiconductor substrate 22 by anisotropic etching (see FIG. 2F). Here, the anisotropic etching is carried out so that the trench 26 is formed with a depth dimension to penetrate through the source region 24 and base region 23, and to reach a part of the semiconductor substrate 22.

Figure 2G:
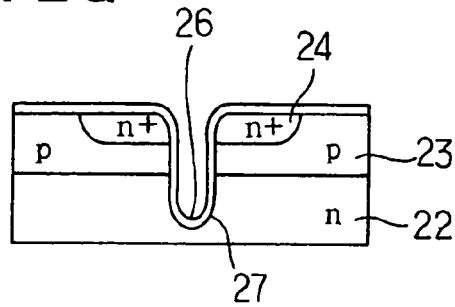
Figure 2H:
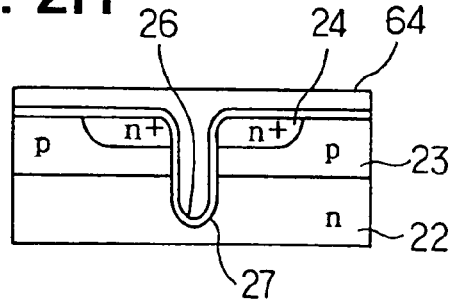
Figure 2I:
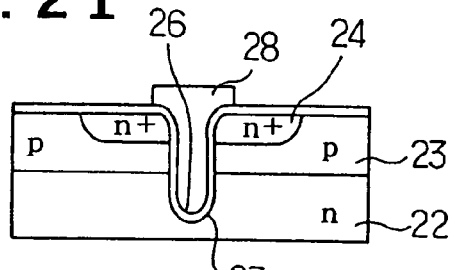
Figure 2J:
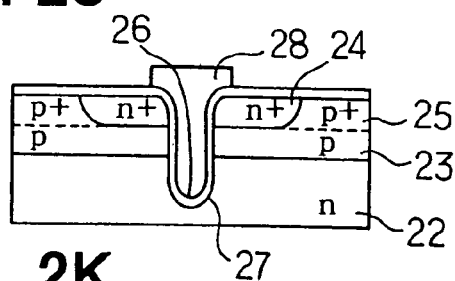
Figure 2K:
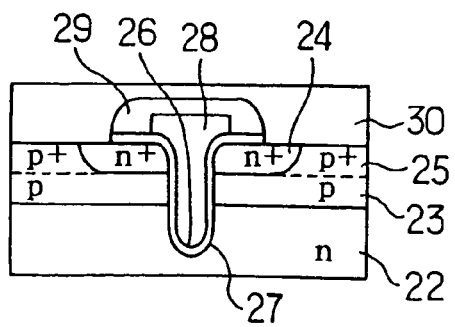

Then, a shape of an inner wall surface of the trench 26 is improved by a sacrificed oxidation step, and after the mask material 61 and sacrificed oxidation film are removed, an ONO (Oxide-Nitride-Oxide) film, for example, is formed as a gate insulation film 27 (see FIG. 2G). Then, a polycrystalline silicon film 64 doped with phosphorous (P) as impurities is deposited on an entire surface of the semiconductor substrate 22, so that the trench 26 covered with the gate insulation film 27 is filled with the polycrystalline silicon film 64 (see FIG. 2H). Subsequently, the polycrystalline silicon film 64 is patterned and etched in such a manner so as to form a T-shaped cross section as shown in the drawing, whereby a gate electrode 28 is formed (see FIG. 2I). A highly doped first conductivity type region for contact having a concentration higher than the source region 24 may be formed inside said source region 24 by serving the T-shaped gate electrode 28 as a part of an implantation mask.

Subsequently, a highly doped p-type region 25 is formed by introducing impurities of the p-type into the base region 23 except the region where the source region 24 is formed at high concentration (see FIG. 2J), and an insulation film 29 is formed entirely. Then, the insulation film 29 is patterned together with the gate insulation film 27 so as to cover a surface portion of the gate electrode 28. Subsequently, a source electrode 30 made of a metal is formed entirely by means of vapor deposition or the like (see FIG. 2K). Finally, a metal electrode is also formed on the back surface (not show), whereby the fabrication sequence of device wafer is completed.

Figure 3A:
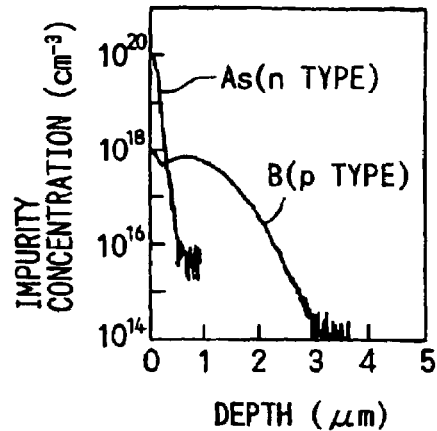
FIG. 3A is a graph showing an impurity concentration profile in a depth direction along a channel of the first embodiment.
Figure 3B:
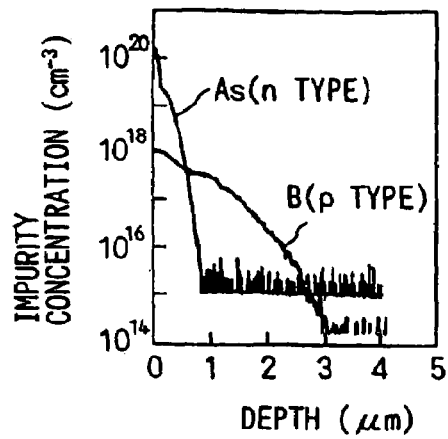
FIG. 3B is a graph showing an impurity concentration profile in a depth direction along a channel of the prior art.

Next, the following description will describe an effect of the present embodiment attained by the arrangement and fabrication sequence described above with data of actual measurements. FIG. 3A is a measured value showing an impurity concentration profile along the channel when the base region 23 is formed by the manufacturing method of the present embodiment. FIG. 3($b$) is a measured value showing an impurity concentration profile at an equivalent position in the conventional device for comparison.

As can be understood from these drawings, the profile of B (boron) as the p-type impurities in the device of the present embodiment changes gradually to shape a trapezoid along the depth direction, and is improved significantly in comparison with a profile in the conventional device that shows a sharp drop tendency. The reason of the improvement is that the base region 23 is provided by forming the ion implantation layers 62 and 63 at deep regions by carrying out the high acceleration ion implantation step twice and re-distributing the impurities by annealing.

By attaining the gradual impurity concentration profile in the channel portion of the base region 23, the followings can be obtained as the electrical characteristics of the MOSFET 21. To be more specific, the MOSFET 21 (the device of the present invention) of the trench gate type of the present embodiment manufactured by the fabrication sequence described above, and a MOSFET of the trench gate type (conventional device) manufactured by a conventional fabrication sequence, both employing the same gate insulation film and having substantially the same threshold value (see FIG. 4A), were prepared. Then, a sheet resistance value ($\Omega/\square$) at the pinch resistance portion in each was compared. A result is shown in FIG. 4B.

Figure 4A:
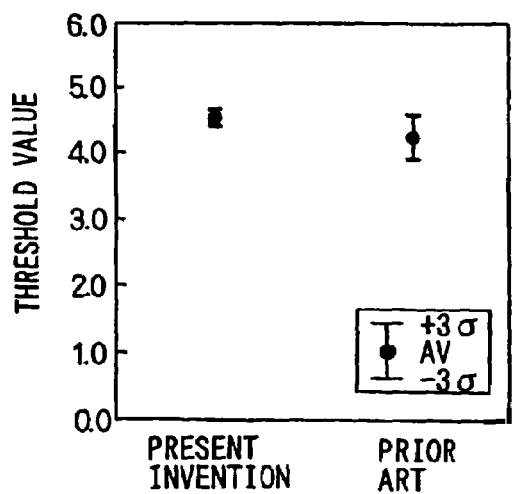
FIG. 4A is a graph showing threshold value of the first embodiment and prior art.
Figure 4B:
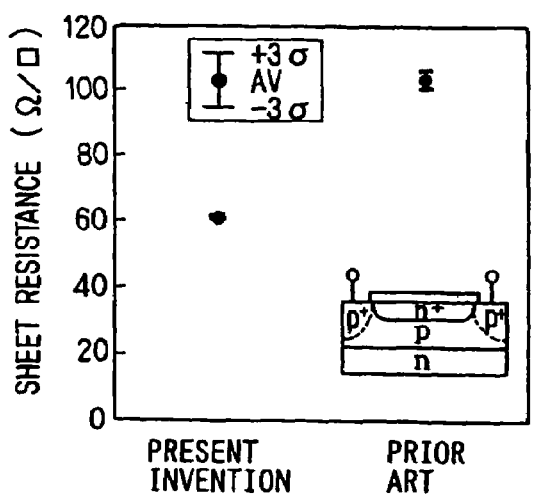
FIG. 4B is a graph showing sheet resistance of the first embodiment and the prior art.

FIG. 4B reveals that although film thickness of the gate insulation film and threshold value are substantially the same in both, the pinch resistance is reduced markedly in the device of the present invention in comparison with the conventional device. In addition, the sub-threshold voltage coefficient was measured in each MOSFET, and a result is set forth in FIG. 5. Also, a conductance value gm/W($\mu$S/$\mu$m) per gate width in each was compared, and a result is set forth in FIG. 6.

Figure 5:
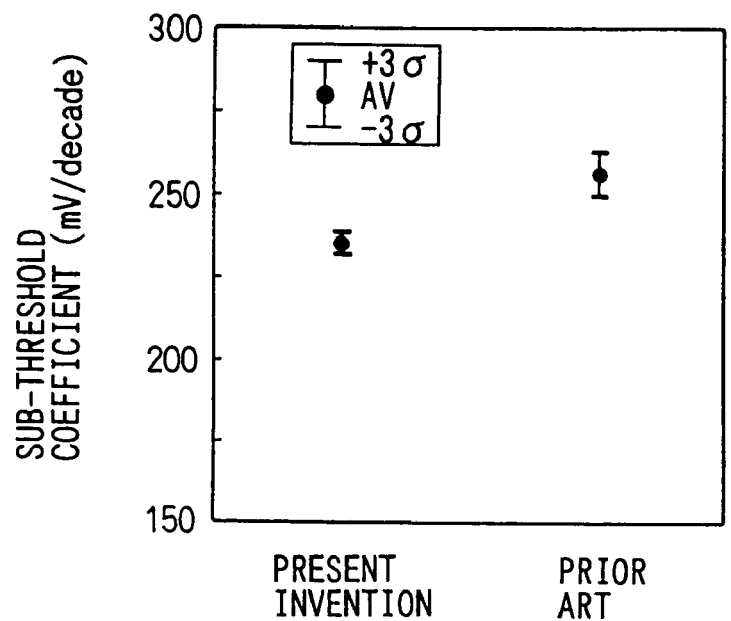
FIG. 5 is a graph showing sub-threshold voltage coefficients of the first embodiment and the prior.
Figure 6:
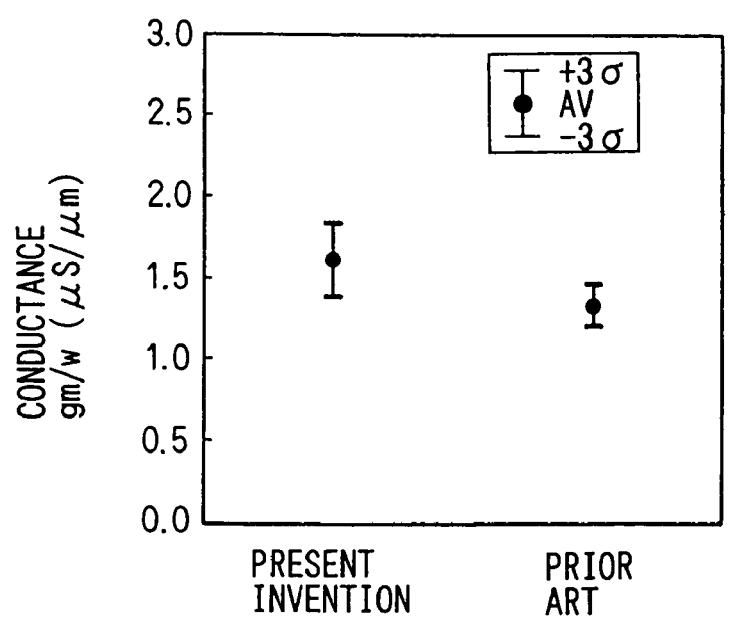
FIG. 6 is a graph showing conductance of the first embodiment and the prior art.

As can be understood from FIG. 5, the sub-threshold voltage coefficient that contributes to the cut-off characteristics and the amplification factor of the FET is improved in the device of the present invention in comparison with the conventional device. Further, as can be understood from FIG. 6, the conductance value gm/W that contributes to the current performance of the FET is improved by approximately 20% in the device of the present invention in comparison with the conventional device.

According to the present embodiment, by focusing on the impurity concentration along the channel of the trench gate type semiconductor device, the base region 23 is formed by carrying out the high acceleration ion implantation step twice so as to increase the impurity concentration in the channel region 23, so that the impurity concentration profile in the base region 23 changes gradually. Consequently, not only can variation of the threshold value be lessened, but also the pinch resistance can be reduced. In addition, since the sub-threshold voltage coefficient and the conductance value can be improved as well, it is possible to improve the electrical characteristics.

In the present embodiment, the high acceleration ion implantation step was carried out twice in forming the base region 23. It should be noted, however, that the number of times of the ion implantation step is not limited to two, and the same can be carried out three times or more to improve the impurity concentration profile. In addition, the dosage of implant ions can be changed in accordance with predetermined demands by predicting the distribution of the impurities after annealing.

(Second Embodiment)

The following description will describe a second embodiment of the present invention with reference to FIGS. 7 through 17 chiefly regarding a difference from the first embodiment. The second embodiment includes a first type of the basic arrangement and various modifications. Thus, the structure and manufacturing method of each will be explained first, and thence measured value of electric characteristics for each will be explained.

(1) First Type

Figure 7:
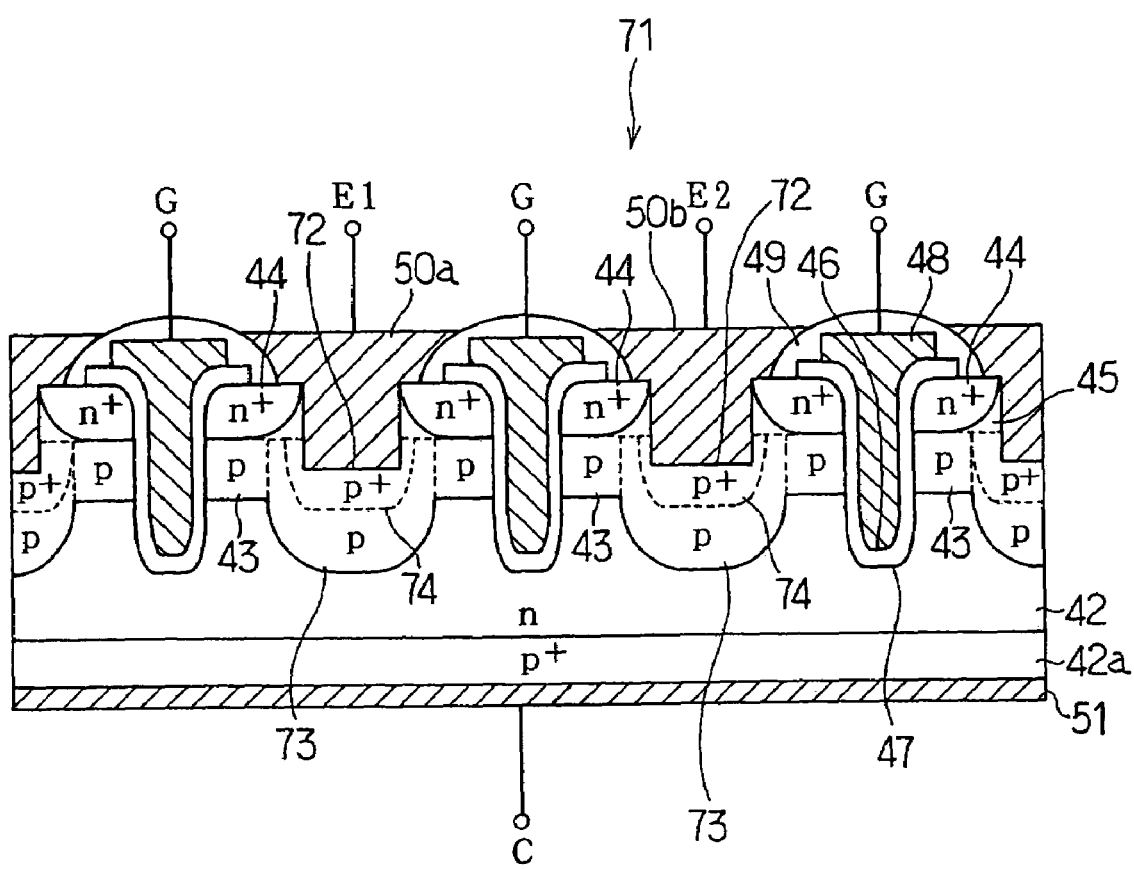
FIG. 7 is a schematic cross sectional view showing a first type of a second embodiment corresponding to a structure shown in FIG. 1B.

FIG. 7 is a schematic cross section of a trench gate type IGBT 71 of the first type as a basic arrangement. The following description will describe a difference between the IGBT 71 and the IGBT 41 of the first embodiment. The trench gate portion of the IGBT 71 is basically the same as that of the IGBT 41, and additionally, an emitter trench 72 is formed as a second trench in the base region 43 between adjacent trenches 46 each as a first trench, and a P body region 73 as a second conductivity type protrusion region and a highly doped p-type region 74 are formed by introducing impurities through the emitter trench 72. The second embodiment is also arranged differently from the first embodiment in that adjacent emitter electrodes 50 are formed as different emitter electrodes 50$a$ and 50$b$.

The junction depth of the P body region 73 described above is provided to reach below a bottom surface portion of the trench 46. In other words, the trench 46 is formed shallower than the P body region 73. As a result, the P body region 73 alleviates concentration of an electric field developed at the bottom surface portion of the trench 46, and therefore, the P body region 73 is furnished with a function to prevent deterioration of the gate insulation film 47.

Next, the following description will briefly describe fabrication sequence of the trench gate type IGBT 71 of the first type described above. FIGS. 8A through 8G are schematic cross sectional views detailing fabrication sequence of the trench gate type IGBT 71, in particular, showing a region where the trench 46 will be formed. In these drawings, the highly doped p-type region 42$a$ on a back surface of the semiconductor substrate 42 is omitted. The steps in FIGS. 8A through 8F are the same as those in FIGS. 2A through 2J described above, and the explanation is not repeated herein.

Figure 8A:
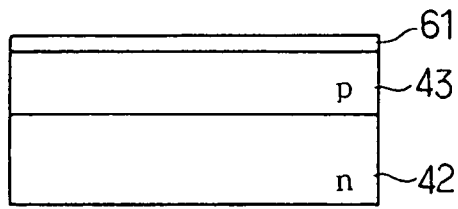
FIGS. 8A through 8G are schematic cross sectional views of the second embodiment.
Figure 8B:
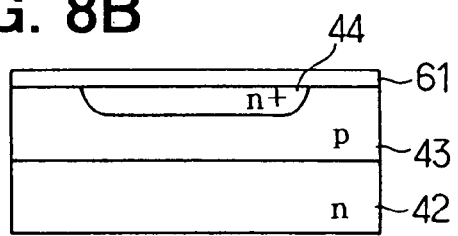
Figure 8C:
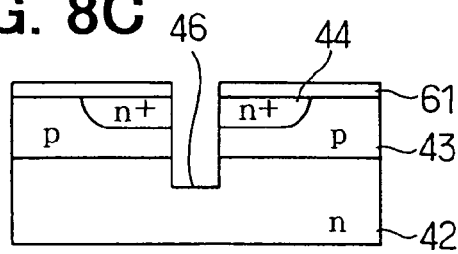
Figure 8D:
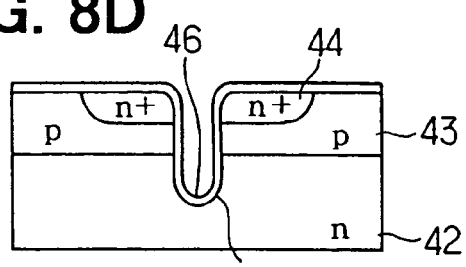
Figure 8E:
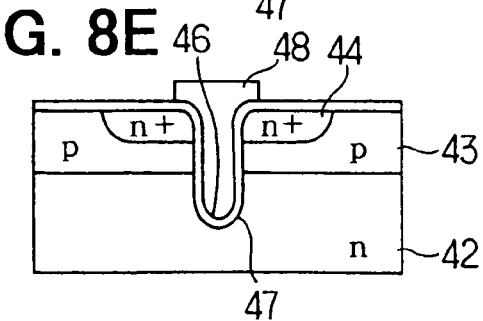
Figure 8F:
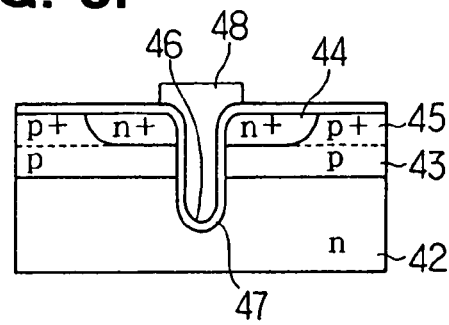
Figure 8G:
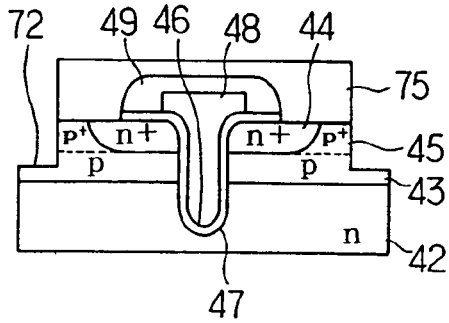

After a gate electrode 48 is formed as shown in FIG. 8F by completing steps thus far, an insulation film 49 is formed and patterned to cover the gate electrode 48, and a mask material 75 is formed further by patterning (FIG. 8G). The mask material 75 is patterned in such a manner that an opening for forming the emitter trench 72 described above is provided. Then, the emitter trench 72 having a predetermined depth dimension in a film thickness direction of the semiconductor substrate 42 is formed by anisotropic etching.

Figure 9A:
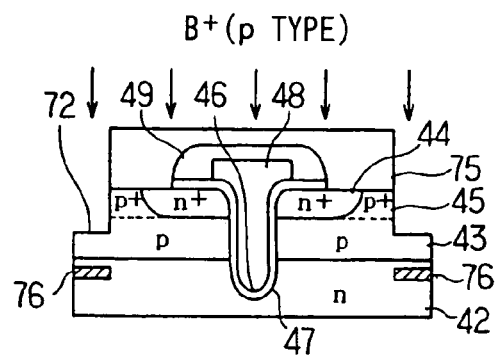
FIGS. 9A through 9F are schematic cross sectional views of the second embodiment.
Figure 9D:
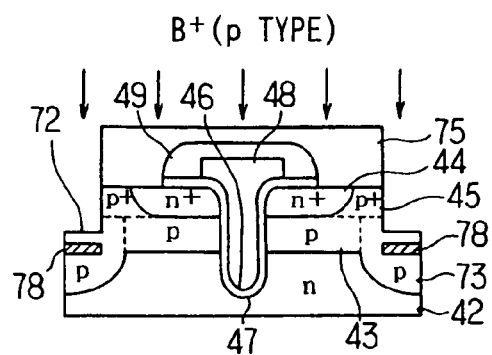
Figure 9B:
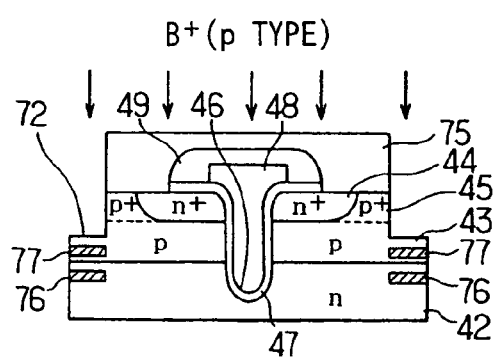
Figure 9E:
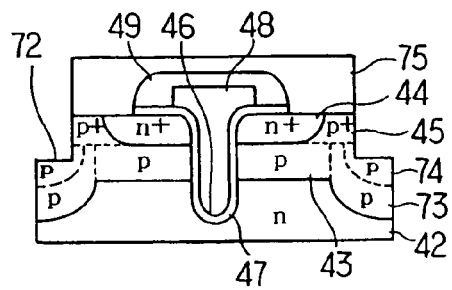

Subsequently, as shown in FIG. 9A, a first ion implantation layer 76 is formed only inside the emitter trench 72 by using the mask material 75. Here, impurities of the second conductivity type (p-type), for example, boron (B), are implanted by a first high acceleration ion implantation at an acceleration voltage of 480 keV, for example. Then, a second ion implantation layer 77 is formed by implanting impurities of the p-type, for example boron (B), inside the emitter trench 72 using the same mask material 75 by a second high acceleration ion implantation at an acceleration voltage of 320 keV, for example, which is different from that in the first high acceleration ion implantation (see FIG. 9B).

Figure 9C:
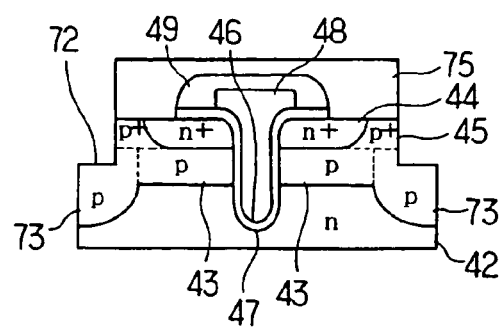

Subsequently, the impurities in the first and second ion implantation layers 76 and 77 are diffused by annealing, whereby the P body region 73 is formed (see FIG. 9C). Then, an ion implantation layer 78 is formed by implanting impurities of the p-type, for example boron (B), only inside the emitter trench 72 by using the same mask material 75 again by ion implantation at an acceleration voltage of 20 kev with a dosage of $4.0 \times 10^{15}$ (atoms/cm$^2$) (see FIG. 9D). Then, annealing is carried out at a low temperature for a short time, for example, at 950° C. for 20 minutes, whereby a highly doped p-type region 74 with a deep junction is formed (see FIG. 9E).

Figure 9F:
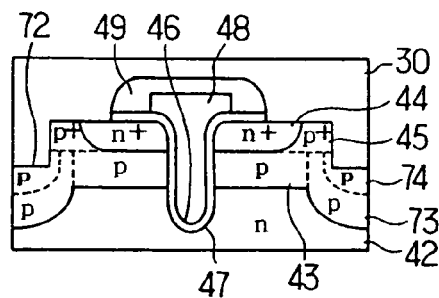

Subsequently, the mask material 75 is removed, and the emitter trench 72 is filled with aluminum alloy by forming a film of aluminum alloy on the surface by means of high temperature flow sputtering, whereby the emitter electrodes 50*a* and 50*b* are formed (see FIG. 9F). Further, a back surface electrode forming step (not shown) is carried out, whereby the semiconductor device is fabricated.

(2) Second type

Figure 10:
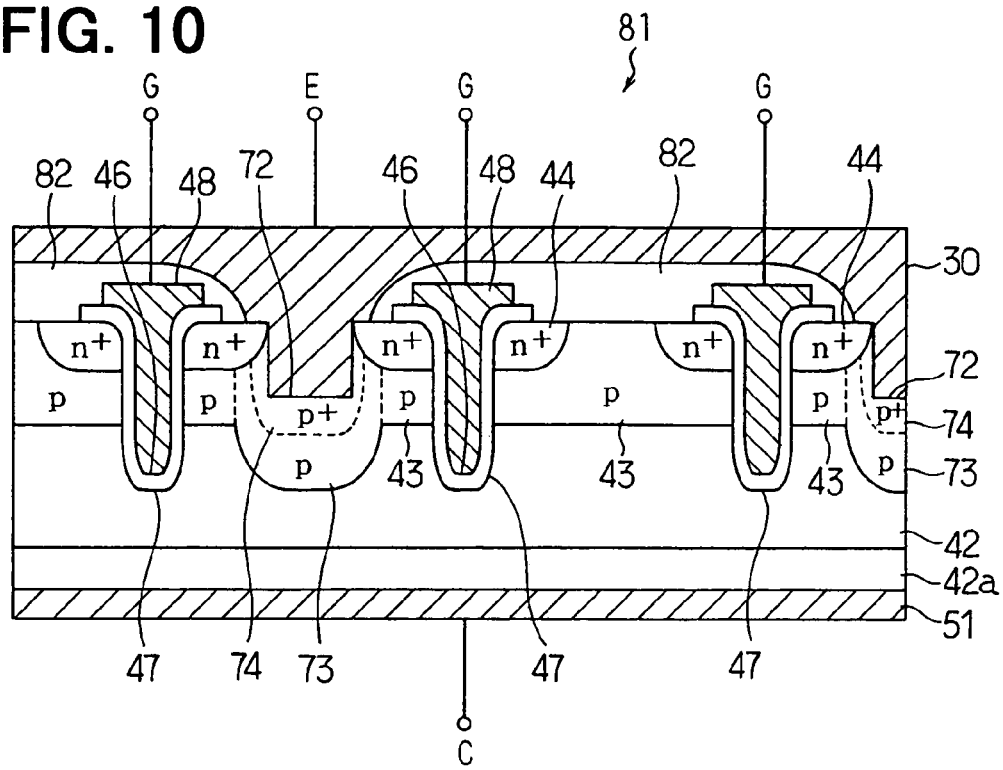
FIG. 10 is a schematic cross sectional view showing a second type of the second embodiment.
Figure 11:
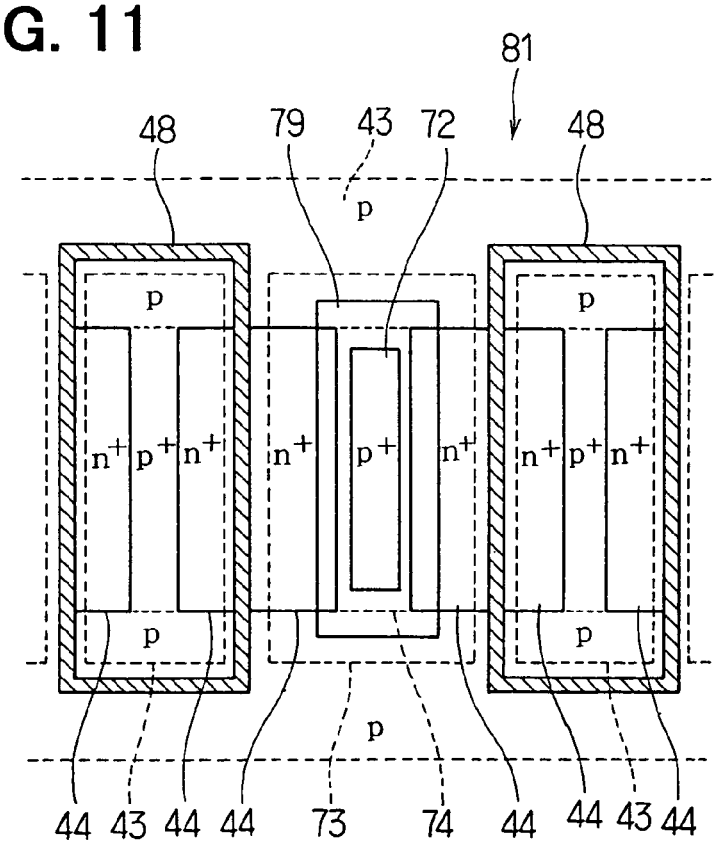
FIG. 11 is a schematic plan view showing an alignment of a gate electrode portion.

Next, the following description will describe a trench gate type IGBT 81 of second type with reference to FIGS. 10 and 11. As shown in FIG. 11, in the IGBT 81 of the second type, a gate electrode 48 is formed as a closed rectangle for each unit region in a plan pattern. In other words, adjacent gate electrodes 48 shown in FIG. 10 are connected annularly at portions apart from emitter regions 44.

An emitter trench 72 and a P body region 73 are formed in an emitter region 44 between each pair of the gate electrodes 48 connected annularly in rectangle. Further, an emitter electrode 50 is formed through a contact hole 79. In addition, an inside of a region enclosed by the gate electrode 48 is not provided with the emitter trench 72, and is covered directly with an insulation film 82.

Consequently, it is arranged such that one of both regions of the p-type regions 43 provided at both sides of the gate electrode 48 at a P body region 73 forming side is used as the channel, and the remaining at the other side enclosed by the gate electrode 48 is not used as the channel. Hence, the channel is formed at the P body region 73 side of the gate electrode 48 during an ON state, while the side enclosed by the gate electrode 48 floats electrically, thereby making it possible to increase the carrier releasing efficiency. As a result, it is possible to reduce ON resistance or ON voltage markedly.

(3) Third and Fourth Types

Figure 12A:
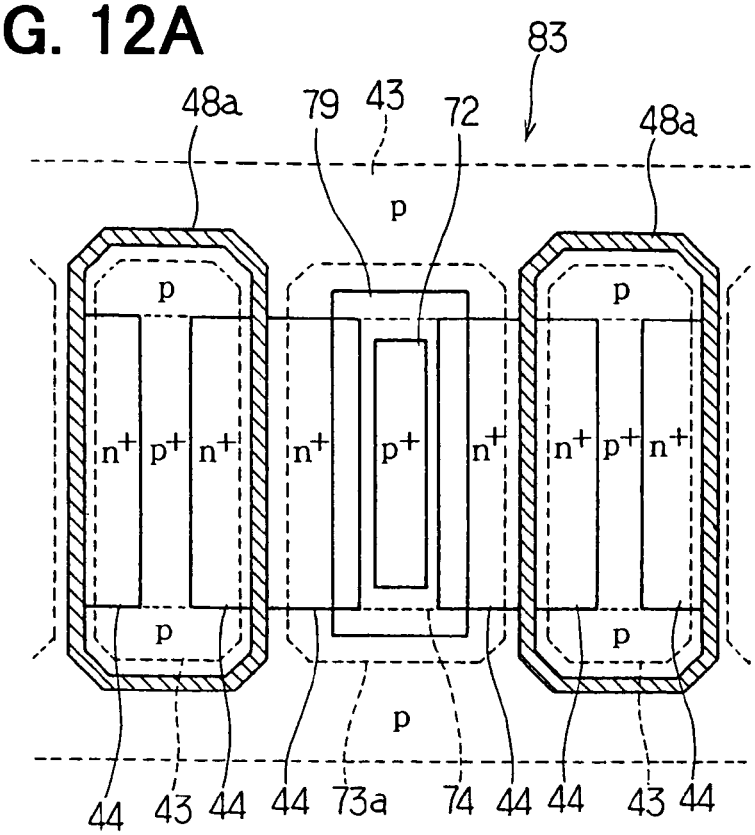
FIGS. 12A and 12B are schematic plan views showing alignments of a gate electrode portion of third and forth type of the second embodiment.
Figure 12B:
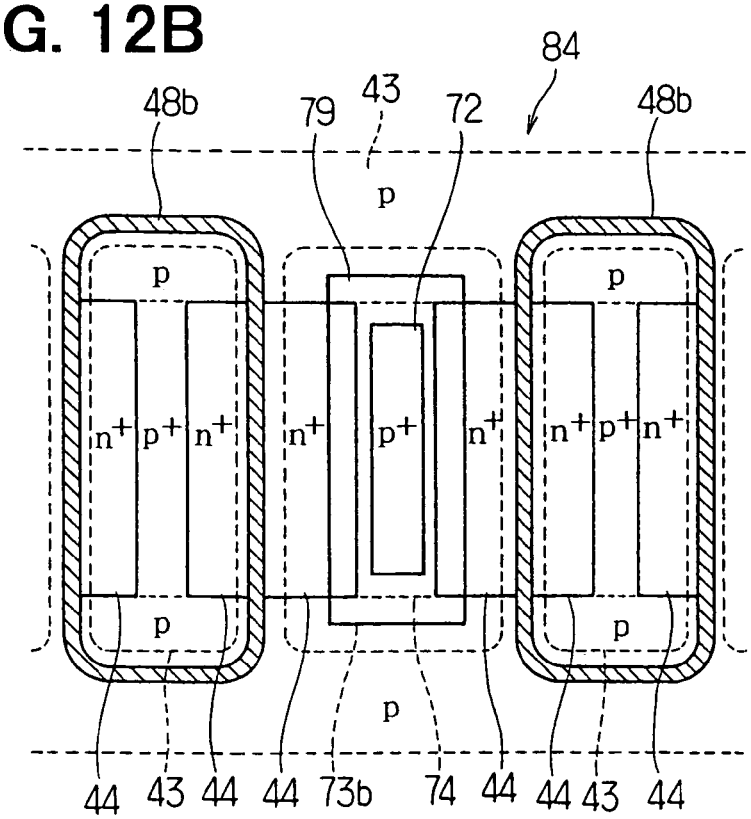

FIG. 12A shows a trench gate type IGBT 83 of a third type. Here, gate electrodes 48*a* having inclined portions at corners thereof are provided instead of the gate electrodes 48 having a rectangular plane pattern in the trench gate type IGBT 81 of the second type. Likewise, FIG. 12B shows a trench gate type IGBT 84 of a fourth type, wherein gate electrodes 48*b* having rounded corner portions are provided. By forming the annularly closed patterns of the gate electrodes 48*a* and 48*b*, the occurrence of a crystal defect caused by thermal stress or the like can be prevented, thereby making it possible to improve the gate characteristics.

(4) Fifth Type

Figure 13A:
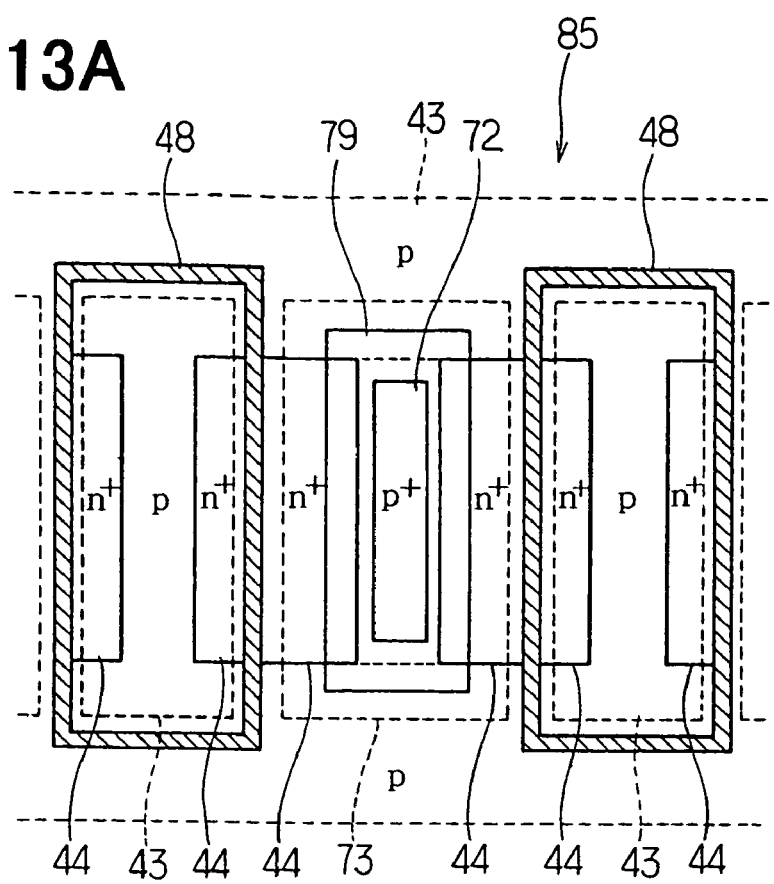
FIGS. 13A and 13B are schematic plan views showing alignments of a gate electrode portion of fifth and sixth types of the second embodiment.

FIG. 13A shows a trench gate type IGBT 85 of the fifth type, which is arranged in such a manner that the highly doped p-type region 45 for contact is not provided in the p-type region 43 enclosed by the gate electrode 48. This is because the emitter electrode 50 is not provided in that region, it is unnecessary to form the highly doped p-type region 45.

Since the region enclosed by the gate electrode 48 is in the electrically floating state, it is unnecessary to provide the emitter region 44 within that region from the viewpoint of the electrical arrangement of the element. Nevertheless, the highly doped n-type emitter region 44 is provided herein for the following reason. That is, by providing the emitter region 44, the trench 46 can be formed with an opening in a convex round shape as shown in FIG. 10 by means of etching that depends on a impurity concentration when surface treatment is applied following the anisotropic etching. Thus, it is possible to improve the electrical characteristics when the gate insulation film 47 and gate electrode 48 are formed in succession.

(5) Sixth Type

Figure 13B:
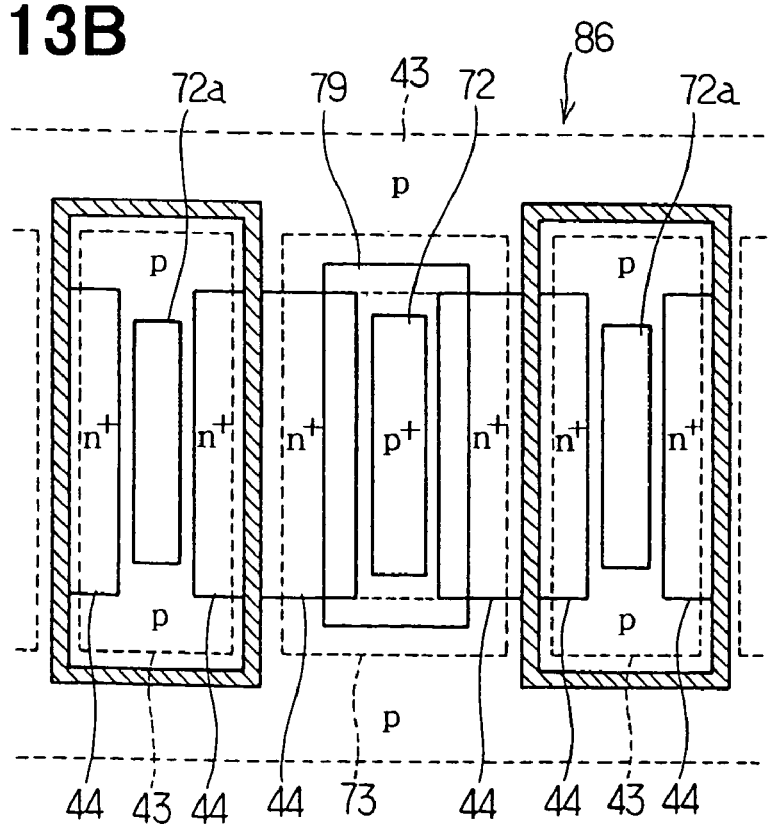

FIG. 13B shows a trench gate type IGBT 86 of the sixth type. According to this arrangement, an emitter trench 72*a* is formed within the region enclosed by the gate electrode 48 so as to form the P body region 73, and then the emitter electrode 50*b* is provided. It should be noted, however, that the emitter electrode 50*b* is not electrically connected to the emitter electrode 50*a* provided in the region between the adjacent gate electrodes 48, and is placed in the electrically floating state.

(6) Description of Measured Value of Characteristics of the Present Embodiment

Next, the following description will describe, with reference to FIGS. 14 through 17, simulation results and measured value of the characteristics when the arrangement of the present embodiment is adapted.

Figure 14:
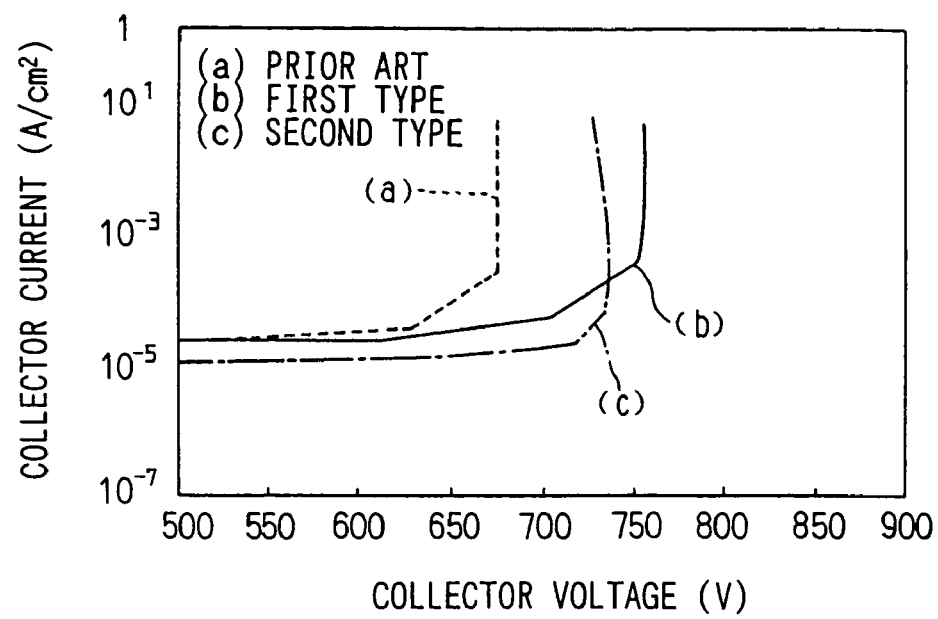
FIG. 14 is a graph showing a simulation of breakdown voltages.
Figure 16:
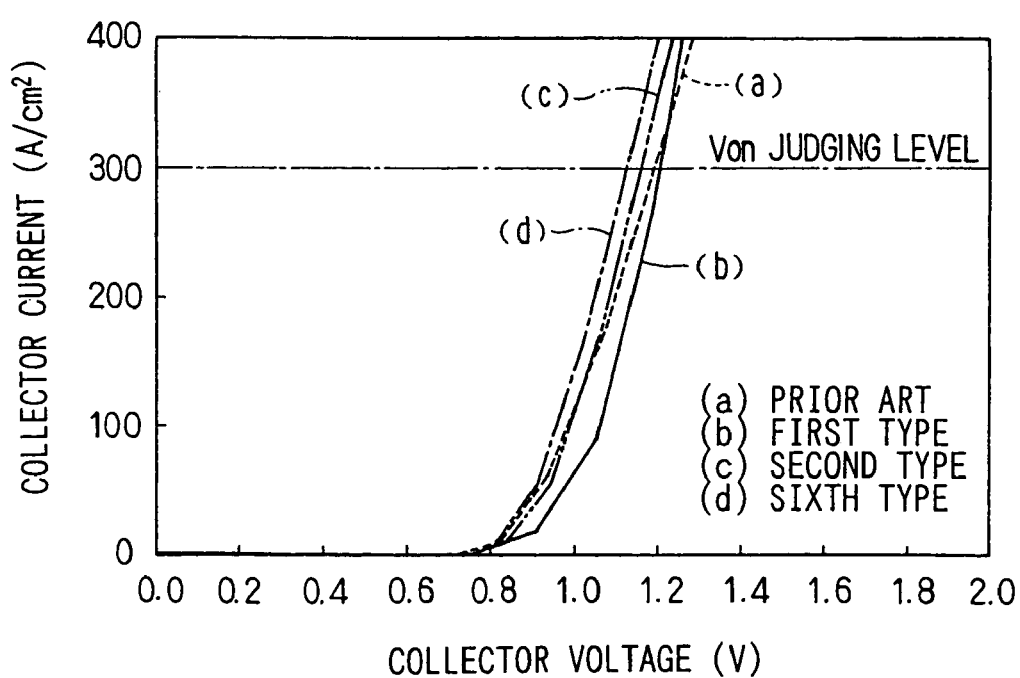
FIG. 16 is a graph showing characteristics of a collector voltage Vce versus a collector current Ic in the IGBTs of the first, second, and sixth types and the prior art by a simulation.

First of all, an explanation is given regarding the characteristics in case of providing the P body region 73, which is one of the features of the present embodiment. FIG. 14 is a graph showing Ic-Vce characteristics obtained when a primary breakdown state is simulated with the trench gate type IGBTs arranged in accordance with the present embodiment.

Figure 22A:
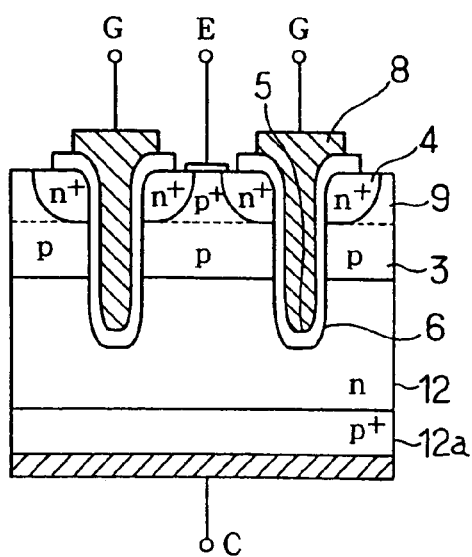
FIG. 22A is a schematic cross sectional view of prior art.
Figure 22B:
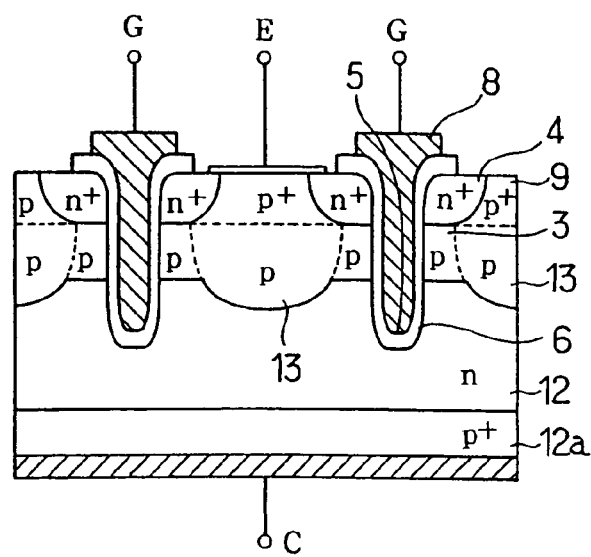
FIG. 22B is a schematic cross sectional view of prior art.
Figure 23A:
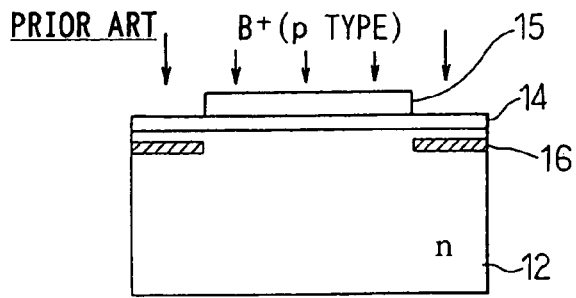
FIGS. 23A through 23I are schematic cross sectional views showing manufacturing steps of the prior art.
Figure 23B:
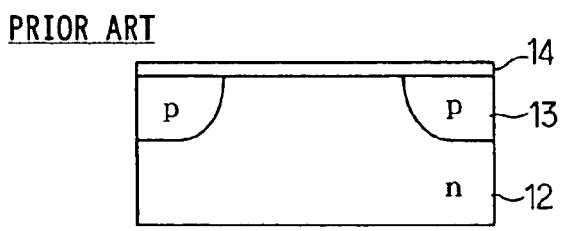
Figure 23C:
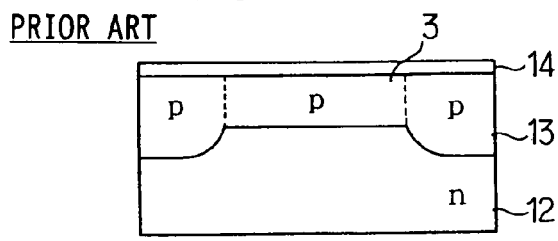
Figure 23D:
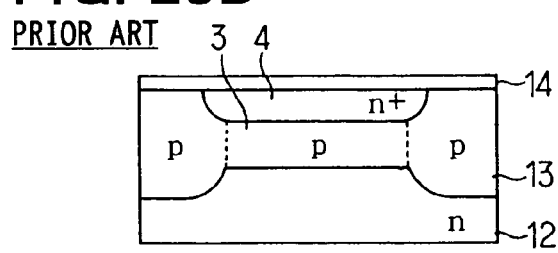
Figure 23E:
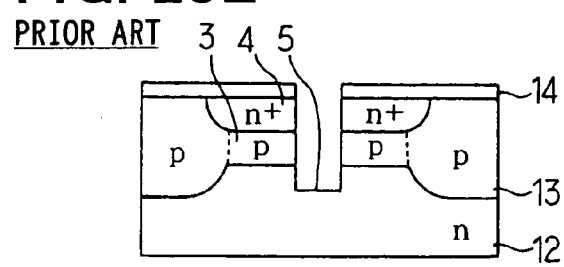
Figure 23F:
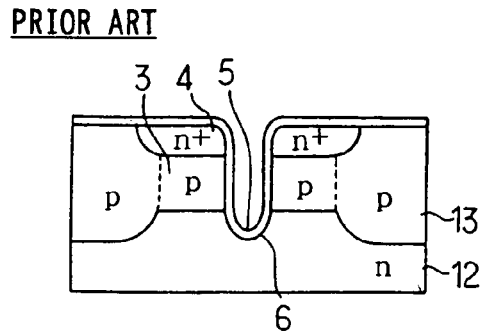
Figure 23G:
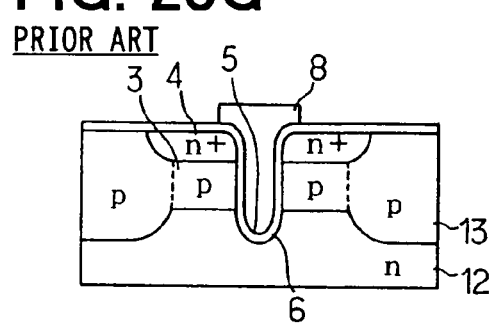
Figure 23H:
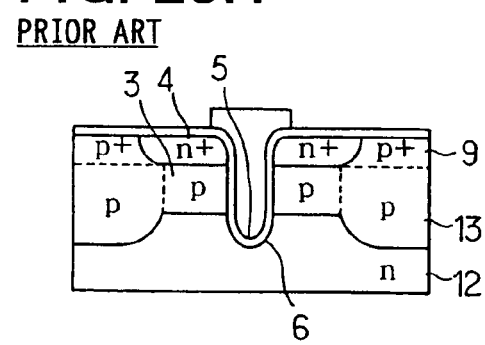
Figure 23:
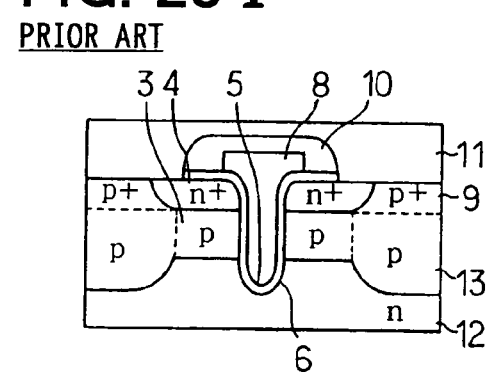

In the drawing, the characteristics of the conventional structure shown in FIG. 22A are indicated by a broken line (a) for comparison, and those of the IGBT 71 of the first type and the IGBT 81 of the second type of the present embodiment are indicated by a solid line (b) and an alternate long and short dash line (c), respectively (herein, the trench 46 where the gate electrode 48 is formed is made shallower than the P body region 73).

Figure 15A:
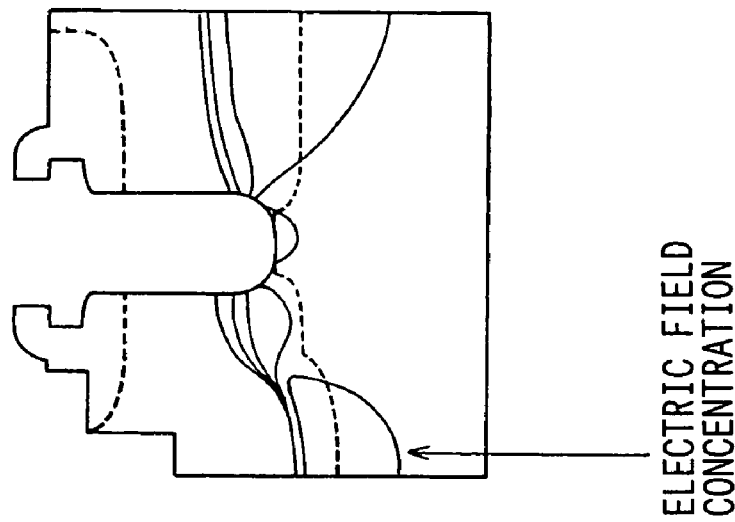
FIG. 15A is a cross sectional view by simulation of prior art showing electric field intensity at a breakdown.
Figure 15B:
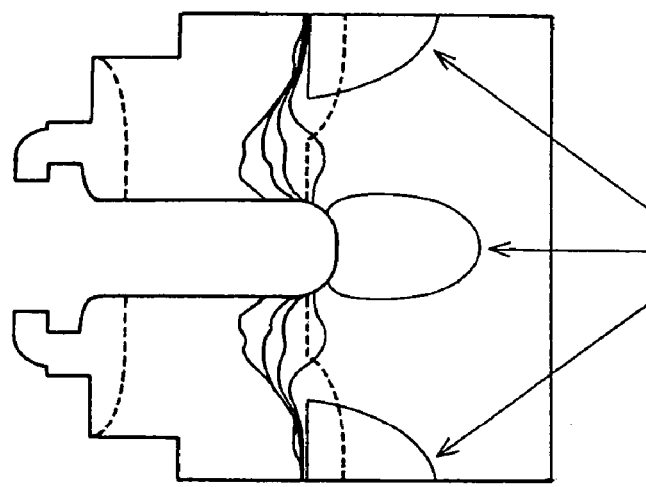
FIG. 15B is a cross sectional view by simulation of the first type of the second embodiment showing electric field intensity at a breakdown.
Figure 15C:
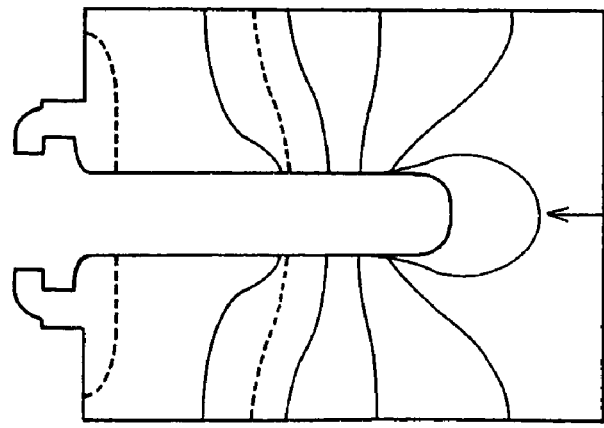
FIG. 15C is a cross sectional view by simulation of the second type of the second embodiment showing electric field intensity at a breakdown.

FIGS. 15A through 15C show distribution of electric field when the breakdown is occurred in the foregoing structures, respectively. FIGS. 15A through 15C, each showing the distribution of the electric field, represent simulation on cross section of the semiconductor substrate around the gate electrode portion in their respective structures. In each drawings, a broken line indicates interface of p-n junction, and a solid line indicates an isoelectric line. Further, in each drawings, the lowest isoelectric line is on a higher voltage end.

As can be understood from the simulation shown in FIG. 14, each employs the same semiconductor substrate as that of the conventional structure, breakdown voltage is improved by approximately 50 to 80 V in the IGBTs 71 and 81 of the first and second types of the present embodiment in comparison with the conventional structure.

Moreover, as shown in FIGS. 15A to 15C, although the electric field concentrates at the bottom portion of the gate electrode at the breakdown in the conventional structure (a) shown in FIG. 15A, point of concentration of the electric field can be dispersed to the bottom portions of the gate electrode 48 and P body region 73 in the IGBT 71 of the first type in the structure (b) shown in FIG. 15B. Further, in the IGBT 81 of the second type in the structure (c) shown in FIG. 15C, point of concentration of the electric field can be moved to the bottom portion of the P body region 73 from the bottom portion of the gate electrode 48. Consequently, deterioration of the insulation film 47 caused by damages due to hot carriers generated when the electric field concentrates at the breakdown can be suppressed, thereby making it possible to extend a service life of the gate insulation film 47. In short, not only can the service life of the IGBTs 71 and 81 be extended, but also the long-term reliability can be ensured.

Next, in the IGBTs (a) through (d) of the four different structures including the IGBT 86 of the sixth type described above as IGBT (d) in addition to the foregoing structures, the following characteristics are found by simulation. Here, a gate voltage Vg of 15V was applied to each of the IGBTs (a) through (d), and the characteristics of the collector current Ic versus the collector-emitter voltage Vce were simulated, and also an ON voltage Von at collector current Ic of 300 A/cm$^2$ was simulated. The results are set forth in FIG. 16.

As can be understood from the results, a low ON voltage Von can be attained by the IGBTs (c) and (d) each adapting the structure that the electron releasing channel is provided to the one side alone. This implies that the side of the gate electrode 48 opposite to the channel forming side in the electrically floating state contributes to lower the ON voltage Von.

Figure 17:
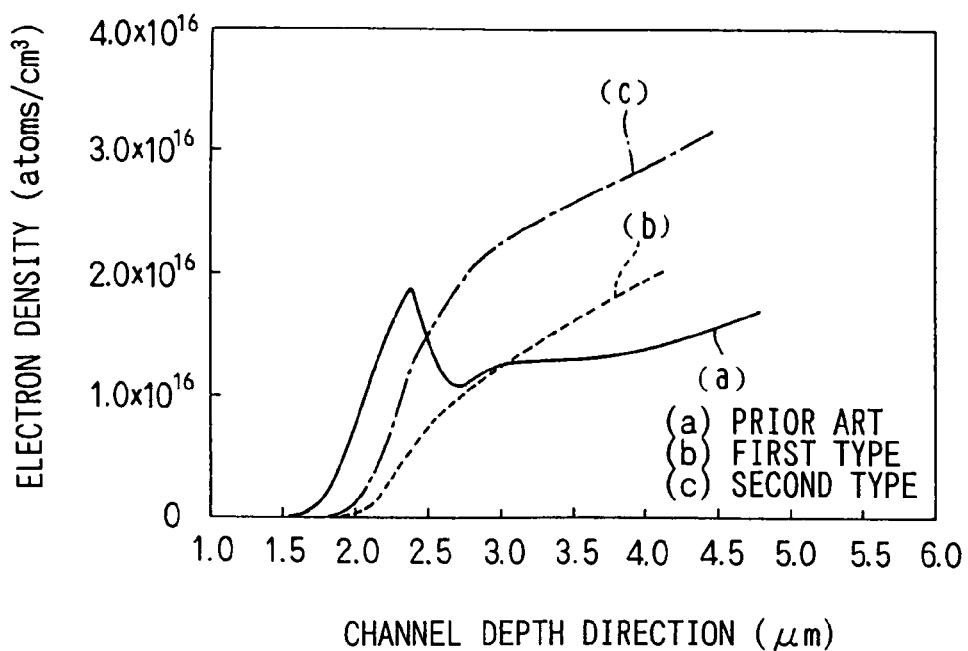
FIG. 17 is a graph showing an electron density distribution in a portion along the channel in the IGBTs of the first and second types and the prior art by a simulation.

In order to clarify this point, distribution of electron density in a direction along the channel portion at a collector voltage Vce of 2.0V and a gate voltage Vg of 15V was simulated with the three types of IGBTs (a) through (c), and the result is set forth in FIG. 17. As can be understood from the result, as already described, a greater amount of electrons flow through the channel in the IGBTs (b) and (c) by making the one side of the gate electrode 48 electrically afloat in comparison with the IGBT (a) of the conventional structure.

According to the second embodiment, the following effect can be attained.

In the first place, like the IGBT 71 representing the first type, by arranging such that the P body region 73 with a deep junction is provided in the base region 43 between the gate electrodes 48 of the adjacent trenches 46, not only can the breakdown voltage be improved, but also the point of concentration of the electric field can be dispersed to the bottom portions of the gate electrode 48 and P body region 73. Consequently, the reliability can be improved by reducing damages of the hot carries on the gate insulation film 47.

In the second place, like the IGBT 81 representing the second type, by adopting the structure such that the channel is formed at the one side of the gate electrode 48 and the other side is electrically floated, the carrier releasing efficiency can be improved. As a consequence, the ON resistance or ON voltage can be reduced markedly.

(Third Embodiment)

Figure 19:
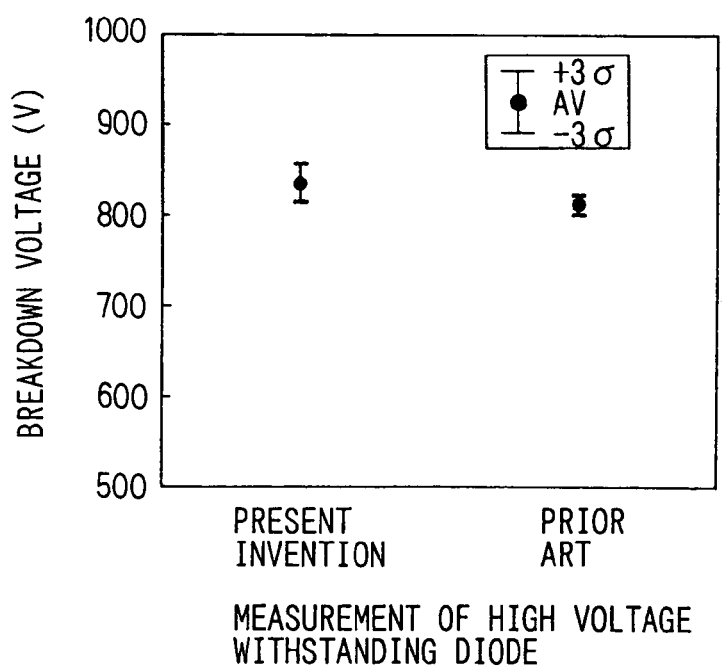
FIG. 19 is a graph showing a withstand voltage in a diode adapting a high voltage withstanding structure.
Figure 18:
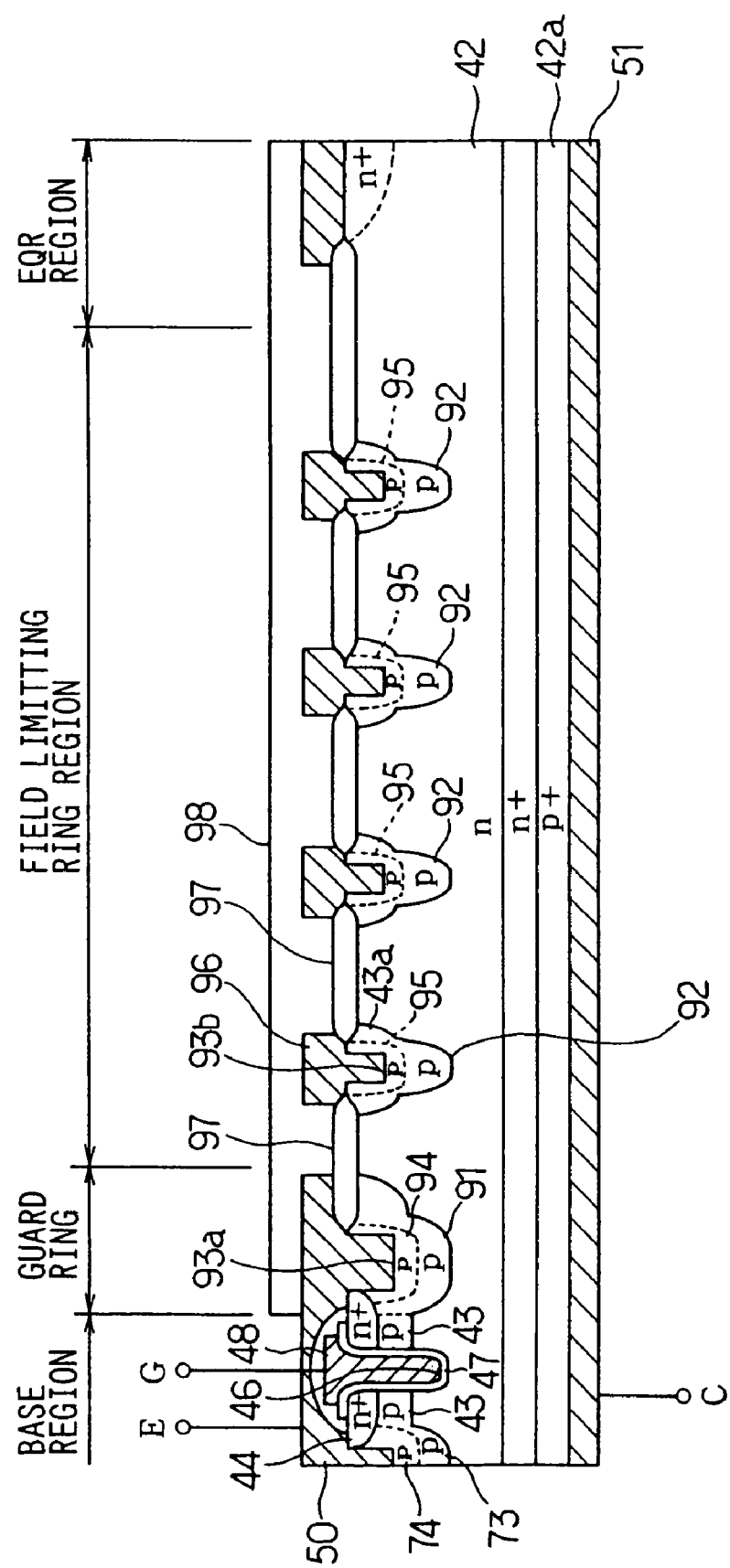
FIG. 18 is a schematic cross sectional view showing a major portion in accordance with a third embodiment of the present invention.
Figure 20A:
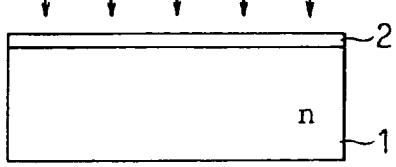
FIGS. 20A through 20J are schematic cross sectional views showing manufacturing steps of the prior art.
Figure 20B:
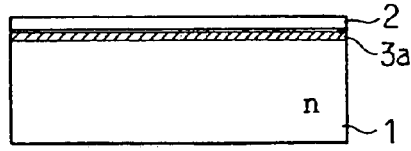
Figure 20C:
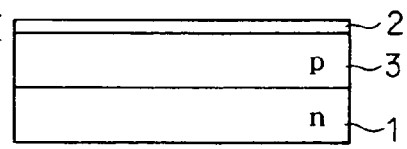
Figure 20D:
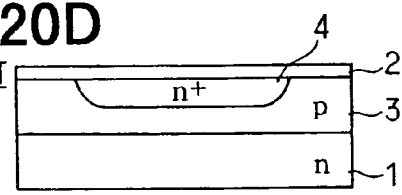
Figure 20E:
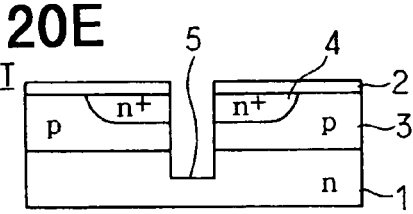
Figure 20F:
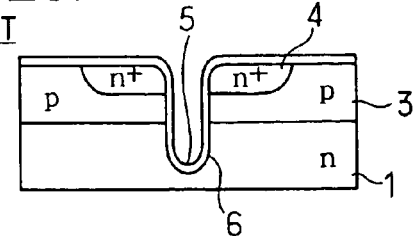
Figure 20G:
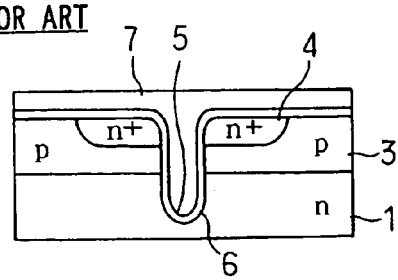
Figure 20H:
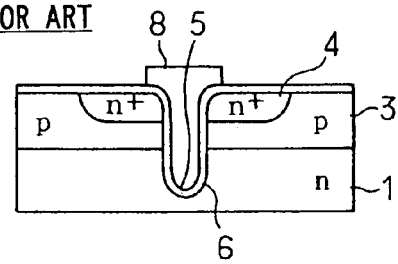
Figure 20:
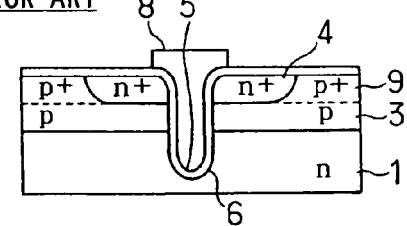
Figure 20J:
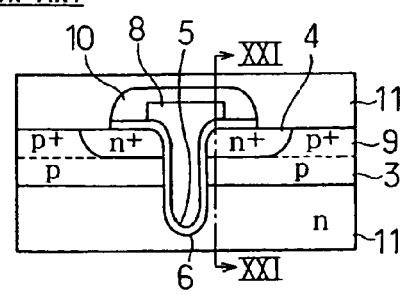
Figure 21:
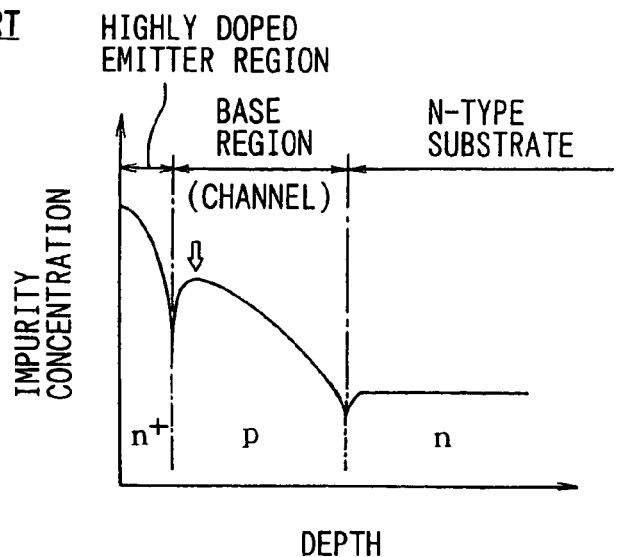
FIG. 21 is a graph showing a schematic impurity concentration profile in a depth direction along a channel of the prior art.

FIGS. 18 and 19 show a third embodiment of the present invention, which is devised to improve a structure of a peripheral portion to attain a high withstand voltage. The present embodiment is applicable to each type of the second embodiment provided with the P body layer (region) 73, so that no additional step is necessary in the manufacturing sequence to improve the structure of the peripheral portion.

According to the arrangement herein, as shown in FIG. 18, a guard ring 91 is formed as an electric field alleviating region with a junction deeper than that of the base region 43 in such a manner so as to enclose a peripheral portion of an island of the p-type base region 43. In addition, for example, four field limiting rings 92 each also having a deep junction are provided as four annular electric field alleviating regions in the n-type semiconductor substrate 42 at an outside of the base region 43.

The number, junction depth, and spacing of the field limiting rings 92 are determined based on the impurity concentration and various physical constants of the semiconductor substrate 42. They are set in such a manner that a potential difference shared by the adjacent field limiting rings 92 will be in an appropriate range.

A trench 93a for the ring is provided as a third trench at a portion where the guard ring 91 will be formed in the same shape and the same depth as those of the emitter trench 72 in the step of forming the emitter trench 72. Moreover, in the same step of forming the P body layer 73, the guard ring 91 of the p-type is formed by introducing impurities of the p-type by ion implantation through the trench 93a for the ring. Further, a highly doped p-type region 94 for contact is formed by introducing impurities through the trench 93a for the ring. The emitter electrode 50 is provided to fill the trench 93a for the ring, so that ohmic contact is achieved with the highly doped p-type region 94.

When the island of the p-type base region 43 is formed, a ring of p-type region 43a in a shape corresponding to the island of the p-type base region 43 is formed in advance in a region where each field limiting ring 92 will be formed. Then, in the step of forming the emitter trench 72, a trench 93b for the ring also as the third trench is formed in the same shape and the same width as those of the emitter trench 72.

In the step of forming the P body layer 73, the ion implantation is carried out through each trench 93b for the ring, whereby the p-type field limiting rings 92 are formed by introducing impurities of p-type. Further, by introducing the impurities through each trench 93b for the ring, highly doped p-type regions 95 for the contact are formed. In each p-type region 95, an electrode 96 for the ring is formed in a shape corresponding to the field limiting ring 92 in the step for forming the emitter electrode 50 simultaneously, so that potential will be equal throughout circumference of the field limiting ring 92. A LOCOS 97 is formed on the surface of the semiconductor substrate 42 between the adjacent field limiting rings 92, so that a formation of an accumulation layer that inhibits expansion of a depletion layer on the surface is suppressed.

Consequently, the guard ring is formed in the peripheral portion of the island of the base region 43, and the field limiting ring region is provided in the surface region of the semiconductor substrate 42 at the periphery of the island of the base region 43. Hence, an EQR region, where a so-called EQR is provided, is formed at an outermost portion of the semiconductor chip. In addition, a protection film 98 made of an insulation film is formed on the surface at a portion outside of the guard ring region.

According to the above arrangement, when a voltage is applied between an emitter E and a collector C, the depletion layer expands mainly in the n-type region (in the semiconductor substrate 42 side) outside of the base region 43 by the guard ring 91 and field limiting rings 92. Here, if a curvature of the p-n junction at the end portion of the base region 43 is small, the electric field readily concentrates, and the withstand voltage drops easily. However, since the guard ring 91 is formed to the deep position, a larger curvature is secured, thereby alleviating the concentration of the electric field.

In addition, in the n-type region (in the semiconductor substrate 42 side) at the outside of the base region 43, there is a tendency that the expansion of the depletion layer on the surface of the semiconductor substrate 42 is suppressed, and the electric field readily concentrates in comparison with the bulk of the substrate. However, since the field limiting rings 92 are provided with an adequate spacing so as to share an adequate potential difference so that a dielectric breakdown therebetween is inhibited, the depletion layer is allowed to expand in a satisfactory manner.

Figure 24:
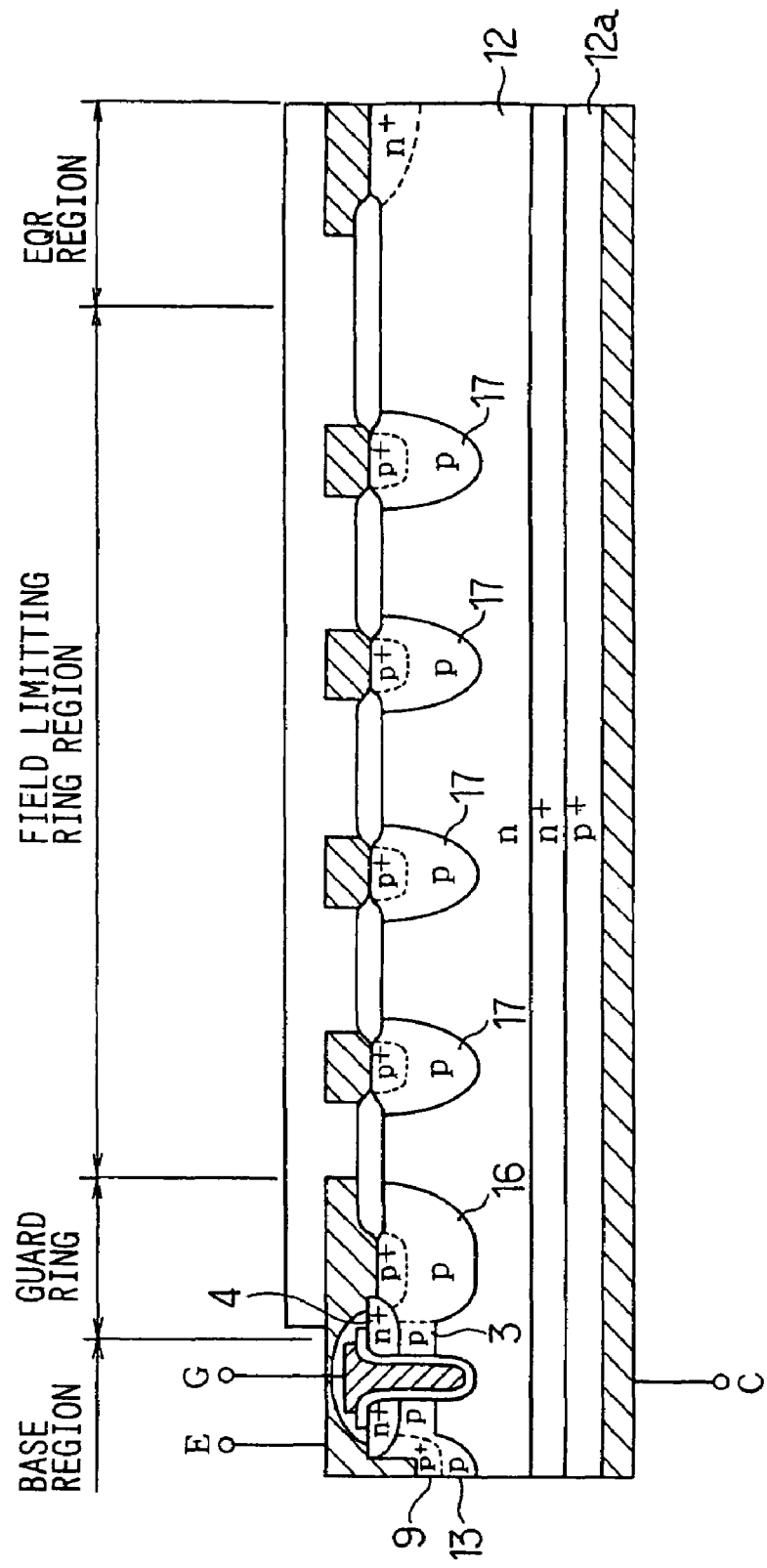
FIG. 24 is a schematic cross sectional view showing a major portion in accordance with the prior art.

Consequently, an overall withstand voltage can be improved. In this case, different from the conventional structure (see FIG. 24), the trenches 93a and 93b for the rings are formed to introduce impurities through the same when forming the guard ring 91 and field limiting rings 92 each with a deep junction. Thus, the lateral diffusion of the impurities is suppressed, whereby it is possible to prevent an overall chip size from being upsized.

FIG. 19 is a graph showing a result when withstand voltage of a sample diode adapting a peripheral structure arranged as described above was measured. Here, the same semiconductor substrate was used, and the curvature of the guard ring 91, the number and spacing of the field limiting rings 92 were also the same as those discussed above. Further, junction depth was made 2.2 μm by introducing impurities of p-type by a high acceleration ion implantation through the trenches 93a and 93b for the rings having a depth of 1.0 μm in the sample diode. As a result, the junction depth of the guard ring 91 and field limiting rings 92 is 3.2 μm from the surface of the semiconductor substrate 42. For comparison, a sample high voltage withstanding diode of the conventional arrangement (see FIG. 24) was assembled and the break down voltage was measured. Here, the junction depth of the guard ring and field limiting rings is 4.0 μm in the conventional arrangement.

As can be understood from FIG. 19, the diode adapting the structure of the present invention was able to attain the breakdown voltage (800 V or above) at least as high as that of the diode adapting the conventional arrangement. Consequently, the high voltage withstanding structure that requires a deep junction can be obtained while suppressing the lateral overgrowth of the guard ring 91 and field limiting rings 92, thereby making it possible to prevent the chip size from being upsized.

(Other Embodiments)

It should be noted that the present invention is not limited to the foregoing embodiments, and can be modified or broadened as follows.

In the first embodiment, the impurities are introduced into the base region 43 by carrying out the ion implantation twice. However, a step of carrying out the ion implantation three times or more is also applicable. Incidentally, a dosage of implant ions or kinds of ion seeds can be changed appropriately in each ion implantation.

In the second embodiment, the P body region 73 is formed by introducing the impurities by carrying out the ion implantation twice. However, like in the first embodiment, the P body region 73 can be formed by carrying out the ion implantation three times or more. In addition, kinds of ion seeds or a dosage of implant ions can be change appropriately.

Also, the plan pattern of the gate electrodes 48 can be changed into an adequate shape as might be demanded other than those in the IGBTs 81, 83, and 84.

In the third embodiment, the IGBT having the four field limiting rings 92 at regular intervals is explained as an example. However, the number of the field limiting rings 92 can be two or three, or even five or more. In addition, the space may be irregular as might be demanded.

What is claimed is:

1. A method of manufacturing a semiconductor device comprising:

forming a second conductivity type region in a semiconductor substrate having a principal surface of a first conductivity type by implanting impurities of a second conductivity type two or more times;

forming a first conductivity type region inside the island of said second conductivity type region, said first conductivity type region having a higher impurity concentration than said semiconductor substrate;

forming a trench in a depth direction of said semiconductor substrate by anisotropic etching;

forming a sacrificed oxide film on an inner wall surface of the trench by thermal oxidation;

removing said sacrificed oxide film;

forming an insulation film in an interior of said trench;

filling said trench formed said insulation film with a polycrystalline silicon film;

forming a plurality of electric field alleviating regions by introducing impurities of the second conductivity type in a strip-wise shape so as to enclose a peripheral portion of said second conductivity type region;

forming a plurality of strip-wise highly doped second conductivity type regions each formed inside each of the electric field alleviating regions;

forming a plurality of strip-wise third trenches each formed inside each of the strip-wise second conductivity type regions in a depth direction of said semiconductor substrate by anisotropic etching;

forming a plurality of deeper second conductivity type regions each formed inside each of said third trenches by introducing impurities of the second conductivity type by two or more ion implantation steps;

forming a metal electrode which electrically connects each of said strip-wise second conductivity type region to each of said deeper second conductivity type region; and forming a protection film at least on a surface of the semiconductor substrate except a region where said second conductivity type region underlies.

2. The method of manufacturing a semiconductor device according to claim 1, further comprising, after the trench is filled with the polycrystalline silicon film:

patterning said film of polycrystalline silicon film so that the patterned polycrystalline silicon film has a T-shaped cross section with a wider width than an opening of said trench;

forming a highly doped first conductivity type region having a higher concentration than said first conductivity type region inside said first conductivity type region at a portion not coated by said polycrystalline silicon film; and forming a highly doped second conductivity type layer region inside said first conductivity type region formed at a region enclosed by two of said trenches.

3. The method of manufacturing a semiconductor device according to claim 1, wherein, said second conductivity type region is formed by performing ion implantation two or more times, and the each ion implantation of the impurities of the second conductivity type is carried out under a condition that acceleration energy is 200 keV or higher.

4. The method of manufacturing a semiconductor device according to claim 2, wherein said highly doped first conductivity type region is formed under a condition that a dose of implant ions is $1.0 \times 10^{15}$ (atoms/cm$^2$) or less.

5. A method of manufacturing a semiconductor device comprising:

forming a second conductivity type region in a semiconductor substrate having a principal surface of a first conductivity type;

forming a first conductivity type region inside said second conductivity type region, the first conductivity type region having a higher concentration than said semiconductor substrate;

forming a plurality of first trenches in a depth direction of said semiconductor substrate by anisotropic etching;

forming a sacrificed oxide film formed on an inner surface wall of each of the first trenches by thermal oxidation;

removing said sacrificed oxide film;

forming an insulation film in an interior of each of said first wenches;

filling each of the first trenches with a polycrystalline silicon film;

forming a plurality of second trenches in the second conductivity type region each positioned between an adjacent pair of said plurality of first trenches in parallel with said plurality of first trenches;

forming a second conductivity type protrusion region with a junction deeper than a junction of said second conductivity type region by introducing impurities of the second conductivity type from each of the second trenches by two or more ion implantation steps; and forming a metal electrode so as to electrically connect said first conductivity type region with said second conductivity type protrusion region in each of the second trenches;

after each of the first trenches is filled wit the polycrystalline silicon film, patterning said polycrystalline silicon film so that the patterned polycrystalline silicon film has a T-shaped cross section with a wider width than an opening of each of the first trenches;

forming a highly doped first conductivity type region inside said first conductivity type region at a portion from which said polycrystalline silicon film is removed, said highly doped first conductivity type region having a higher concentration than said first conductivity type region; and forming a highly doped second conductivity type layer region inside said highly doped first conductivity type region at a portion between an adjacent two of said plurality of first trenches.

6. The method of manufacturing a semiconductor device according to claim 5, wherein at least one of said ion implantation steps is carried out at acceleration energy of 200 keV or higher.

7. The method of manufacturing a semiconductor device according to claim 5, wherein at least one of said ion implantation steps is carried out at acceleration energy of 30 keV or lower and a dose of implant ions at $1.0 \times 10^{15}$ (atoms/cm$^2$) or more.

8. The method of manufacturing a semiconductor device according to claim 5, wherein the island of said second conductivity type region is formed by introducing impurities of a second conductivity type by two or more ion implantations.

9. A method of manufacturing a semiconductor device comprising:

forming a second conductivity type region in a semiconductor substrate having a principal surface of a first conductivity type;

forming a first conductivity type region inside said second conductivity type region, the first conductivity type region having a higher concentration than said semiconductor substrate;

forming a plurality of first trenches in a depth direction of said semiconductor substrate by anisotropic etching;

forming a sacrificed oxide film formed on an inner surface wall of each of the first trenches by thermal oxidation;

removing said sacrificed oxide film;

forming an insulation film in an interior of each of said first trenches;

filling each of the first trenches with a polycrystalline silicon film;

forming a plurality of second trenches in the second conductivity type region each positioned between an adjacent pair of said plurality of first trenches in parallel with said plurality of first trenches;

forming a second conductivity type protrusion region with a junction deeper than a junction of said second conductivity type region by introducing impurities of the second conductivity type from each of the second trenches by two or more ion implantation steps;

forming a metal electrode so as to electrically connect said first conductivity type region with said second conductivity type protrusion region in each of the second trenches;

forming a plurality of electric field alleviating regions by introducing impurities of the second conductivity type in a strip-wise shape so as to enclose a peripheral portion of said second conductivity type region;

forming a plurality of strip-wise highly doped second conductivity type regions each formed inside each of the electric field alleviating regions;

forming a plurality of strip-wise third trenches each formed inside each of the strip-wise second conductivity type regions in a depth direction of said semiconductor substrate by anisotropic etching;

forming a plurality of deeper second conductivity type regions each formed inside each of said third trenches by introducing impurities of the second conductivity type by two or more ion implantation steps;

forming a metal electrode which electrically connects each of said strip-wise second conductivity type region to each of said deeper second conductivity type region; and forming a protection film at least on a surface of the semiconductor substrate except a region where said second conductivity type region underlies.

10. The method of manufacturing a semiconductor device according to claim 1, wherein each of said deeper second-conductivity type region has a junction deeper than a junction of said second conductivity type region for forming a channel in a gate driving type power element having a high voltage withstanding characteristics.

11. The method of manufacturing a semiconductor device according to claim 9, wherein each of said deeper second conductivity type region has a junction deeper than a junction of said second conductivity type region for forming a channel in a gate driving type power element having a high voltage withstanding characteristics.

* * * * *